(12) United States Patent
Chandrasekharan et al.

(10) Patent No.: US 12,209,310 B2
(45) Date of Patent: Jan. 28, 2025

(54) CONCENTRATION CONTROL USING A BUBBLER

(71) Applicant: Lam Research Corporation, Fremont, CA (US)

(72) Inventors: Ramesh Chandrasekharan, Lake Oswego, OR (US); Easwar Srinivasan, Portland, OR (US); Erica Sakura Strandberg Pohl, Golden, CO (US); Andrew Borth, Newberg, OR (US); Aleksey V. Altecor, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/001,587

(22) PCT Filed: Jul. 21, 2021

(86) PCT No.: PCT/US2021/042648
§ 371 (c)(1),
(2) Date: Dec. 12, 2022

(87) PCT Pub. No.: WO2022/026271
PCT Pub. Date: Feb. 3, 2022

(65) Prior Publication Data
US 2023/0257878 A1  Aug. 17, 2023

Related U.S. Application Data

(60) Provisional application No. 62/706,056, filed on Jul. 29, 2020.

(51) Int. Cl.
*C23C 16/448* (2006.01)
*C23C 16/26* (2006.01)
(Continued)

(52) U.S. Cl.
CPC .......... *C23C 16/4482* (2013.01); *C23C 16/26* (2013.01); *C23C 16/45561* (2013.01);
(Continued)

(58) Field of Classification Search
None
See application file for complete search history.

(56) References Cited

U.S. PATENT DOCUMENTS 2,146,448 A  2/1939  Scott et al.
2,405,693 A  8/1946  Hamill et al.
(Continued)

FOREIGN PATENT DOCUMENTS

JP  2009226277 A  10/2009
JP  2017100897 A   6/2017
(Continued)

OTHER PUBLICATIONS

Machine translation of JP 2017-100897 A (Year: 2017).*
(Continued)

*Primary Examiner* — Shamim Ahmed
*Assistant Examiner* — Bradford M Gates
(74) *Attorney, Agent, or Firm* — Weaver Austin Villeneuve & Sampson LLP

(57) ABSTRACT

The present disclosure relates, in part, to an apparatus for controlling the concentration of a component within a gas mixture. In particular embodiments, the component is a vaporized liquid component, such as a vaporized stabilizer or a vaporized precursor. Also described are systems thereof and methods for such control.

26 Claims, 23 Drawing Sheets

(51) Int. Cl.
  *C23C 16/455* (2006.01)
  *C23C 16/50* (2006.01)
  *C23C 16/52* (2006.01)
  *H01L 21/67* (2006.01)

(52) U.S. Cl.
  CPC .............. *C23C 16/50* (2013.01); *C23C 16/52* (2013.01); *H01L 21/67017* (2013.01)

(56) References Cited

U.S. PATENT DOCUMENTS

| | | |
|---|---|---|
| 3,816,976 A | 6/1974 | Stork et al. |
| 4,010,777 A | 3/1977 | Mogensen |
| 4,140,735 A | 2/1979 | Schumacher |
| 4,274,841 A | 6/1981 | Andresen et al. |
| 4,863,493 A | 9/1989 | Kotani et al. |
| 5,222,549 A | 6/1993 | Ishii et al. |
| 5,562,952 A | 10/1996 | Nakahigashi et al. |
| 6,006,797 A | 12/1999 | Bulow et al. |
| 6,984,591 B1 * | 1/2006 | Buchanan ............... C23C 16/16 257/E21.174 |
| 7,323,401 B2 | 1/2008 | Ramaswamy et al. |
| 7,820,556 B2 | 10/2010 | Hsu et al. |
| 7,955,990 B2 | 6/2011 | Henri et al. |
| 9,334,566 B2 | 5/2016 | Chandrasekharan et al. |
| 10,094,018 B2 | 10/2018 | Kumar et al. |
| 2002/0192375 A1 | 12/2002 | Sun et al. |
| 2005/0066893 A1 | 3/2005 | Soininen |
| 2008/0211118 A1 | 9/2008 | Wyse et al. |
| 2008/0242912 A1 | 10/2008 | Letessier et al. |
| 2008/0264803 A1 | 10/2008 | Agrawal |
| 2009/0182180 A1 | 7/2009 | Huang et al. |
| 2014/0026977 A1 | 1/2014 | Kimmerle et al. |
| 2014/0029374 A1 | 1/2014 | Kimmerle et al. |
| 2015/0145154 A1 * | 5/2015 | Chandrasekharan ....................... C23C 16/4481 261/147 |
| 2016/0052651 A1 | 2/2016 | Nguyen et al. |
| 2016/0052655 A1 | 2/2016 | Nguyen et al. |
| 2018/0334744 A1 | 11/2018 | Woelk et al. |
| 2019/0024233 A1 | 1/2019 | Kumar et al. |
| 2019/0211449 A1 | 7/2019 | Isobe et al. |
| 2023/0279547 A1 | 9/2023 | Shankarnarayana et al. |

FOREIGN PATENT DOCUMENTS

| | | |
|---|---|---|
| KR | 20070113398 A | 11/2007 |
| WO | WO-2014018740 A1 | 1/2014 |
| WO | WO-2014022219 A1 | 2/2014 |

OTHER PUBLICATIONS

File history dated Jul. 25, 2013 for U.S. Appl. No. 13/950,647.
File History dated Jul. 26, 2013 for U.S. Appl. No. 13/951,513.
International Preliminary Report on Patentability dated Feb. 9, 2023 in PCT Application No. PCT/US2021/042648.
International Preliminary Report on Patentability dated Sep. 22, 2022, in PCT Application No. PCT/US2021/022162.
International Search Report and Written Opinion dated Jul. 7, 2021 in PCT Application No. PCT/US2021/022162.
International Search Report and Written Opinion dated Nov. 3, 2021, in PCT Application No. PCT/US2021/042648.
U.S. Final Office Action dated Apr. 19, 2012 in U.S. Appl. No. 12/786,842.
US Final Office Action, dated Dec. 21, 2009, issued in U.S. Appl. No. 12/133,223.
U.S. Non-Final Office Action dated Aug. 19, 2009 in U.S. Appl. No. 12/133,223.
U.S. Non-Final Office Action dated Nov. 9, 2011 in U.S. Appl. No. 12/786,842.
U.S. Notice of Allowance dated Jul. 20, 2012 in U.S. Appl. No. 12/786,842.
US Notice of Allowance, dated Mar. 2, 2010, issued in U.S. Appl. No. 12/133,223.
US Notice of Allowance, dated Nov. 2, 2010, issued in U.S. Appl. No. 12/334,220.
US Office Action, dated Aug. 19, 2009, issued in U.S. Appl. No. 12/133,223.
U.S. Restriction Requirement dated Aug. 5, 2010 in U.S. Appl. No. 12/334,220.
US Supplemental Notice of Allowance, dated Feb. 8, 2011, issued in U.S. Appl. No. 12/334,220.

* cited by examiner

CONCENTRATION CONTROL USING A BUBBLER

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes. This application claims the benefit of U.S. Provisional Patent Application No. 62/706,056, filed Jul. 29, 2020, which is incorporated herein by reference in its entirety

BACKGROUND

Many semiconductor processes rely on delivery of a mixture of gases and can be sensitive to the concentration of each component within that gas mixture. Yet, such concentrations can be variable, due to changes in experimental conditions during the semiconductor process, variations in the source of such gases, or other reasons.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

The present disclosure relates, in part, to an apparatus for controlling the concentration of a component within a gas mixture. In particular embodiments, the component is a vaporized liquid component, such as a vaporized stabilizer or a vaporized precursor. Also described are systems thereof and methods for such control.

In particular embodiments, the apparatus includes a bubbler configured to hold a liquid, and concentration control is provided by maintaining the bubbler at a constant temperature and pressure. In use, an incoming gas is passed through the liquid in the bubbler, thereby carrying vaporized liquid within the gas stream. Regardless of the concentration of the incoming gas, the output can include a constant concentration of the vaporized liquid component.

When the incoming gas is acetylene and the liquid in the bubbler is acetone, use of the bubbler provides a substantially constant concentration of acetone in the exiting gas stream. This is true even if the incoming gas includes too little or too much acetone. Maintaining the bubbler at a substantially constant temperature and pressure (and allowing the gas stream to have sufficient residence time in the bubbler to become saturated) will ensure that the exiting gas mixture always has the desired concentration of acetone or another stabilizer. In some instances, the bubbler may need to have liquid acetone removed or added depending on the source composition, but the bubbler can do all the work in maintaining the exiting acetylene with a constant concentration of stabilizer.

Accordingly, in a first aspect, the present disclosure encompasses an apparatus including: (a) an upstream flow passage configured to be fluidically coupled to a source of an acetylene and an acetylene stabilizer; (b) a bubbler including an inlet fluidically coupled to the upstream flow passage, and including a chamber for holding a liquid under an atmosphere having a controlled temperature and pressure; (c) one or more controllers configured to cause the bubbler to operate under conditions that adjust a concentration of the acetylene stabilizer in a gas mixture of acetylene and acetylene stabilizer flowing into the bubbler; and (d) a downstream flow passage fluidically coupled to an outlet of the bubbler and configured to transport the gas mixture of acetylene and acetylene stabilizer at a substantially constant concentration value.

In some embodiments, the upstream flow passage (a) is configured to transport the gas mixture of acetylene and acetylene stabilizer from the source of acetylene and acetylene stabilizer. In particular embodiments, the bubbler (b) is configured to: (i) receive the gas mixture of acetylene and acetylene stabilizer from the upstream flow passage (a), and (ii) pass the gas mixture of acetylene and acetylene stabilizer through the liquid in the chamber. In other embodiments, the one or more controllers (c) are further configured to cause the bubbler to operate under conditions that maintain the concentration of the acetylene stabilizer in the gas mixture of acetylene and acetylene stabilizer leaving the bubbler at a substantially constant concentration value over a course of a deposition reaction that reacts acetylene. In yet other embodiments, the downstream flow passage (d) is configured to transport the gas mixture to a deposition reactor for conducting a deposition reaction.

In some embodiments, the apparatus further includes a gas concentration meter fluidically coupled to the upstream flow passage (a) and/or the downstream flow passage (d) and configured to measure a concentration of the acetylene and/or the acetylene stabilizer in the flow passage(s). In other embodiments, the apparatus further includes a valve fluidically coupled to the upstream flow passage (a) and configured to adjust a flow of the gas mixture of acetylene and acetylene stabilizer from the source to the bubbler.

The one or more controllers (c) can be further configured to cause any useful operation. In some embodiments, the one or more controllers are further configured to cause flow of the gas mixture of acetylene and acetylene stabilizer from the source to the deposition reactor to initiate the deposition reaction. In other embodiments, the one or more controllers are further configured to cause the bubbler to maintain the liquid at a substantially constant temperature and/or a substantially constant pressure during the deposition reaction; and/or to control the temperature and the pressure of the atmosphere in the bubbler during the deposition reaction. In yet other embodiments, the one or more controllers are further configured to control a flow rate of the gas mixture of acetylene and acetylene stabilizer through the bubbler.

In addition to acetylene and an acetylene stabilizer, other gas components and vaporized liquid components can be employed. Accordingly, in a second aspect, the present disclosure features an apparatus including: (a) an upstream flow passage configured to be fluidically coupled to a source of a gas component; and (b) a bubbler including an inlet fluidically coupled to the upstream flow passage and including a chamber for holding a liquid under an atmosphere having a controlled temperature and pressure. In particular embodiments, the bubbler is configured to: (i) receive the gas component from the upstream flow passage (a), and (ii) pass the gas component through the liquid in the chamber to form a gas mixture, wherein the gas mixture includes the gas component and a vaporized liquid component including the liquid in vapor form. In some embodiments, wherein the upstream flow passage (a) is further configured to transport the gas component from the source to the bubbler (b).

The apparatus can further include: (c) one or more controllers configured to cause the bubbler to operate under conditions that maintain the concentration of the vaporized liquid component in the gas mixture leaving the bubbler at a substantially constant concentration value; and (d) a downstream flow passage fluidically coupled to an outlet of the bubbler.

In particular embodiments, the substantially constant concentration value (e.g., of the vaporized liquid component in the gas mixture) is provided over a course of a reaction that reacts the gas mixture. In other embodiments, the downstream flow passage (d) is further configured to transport the gas mixture of gas component and vaporized liquid component at the substantially constant concentration value to a reactor for conducting the reaction.

In some embodiments, the apparatus further includes a gas concentration meter fluidically coupled to the upstream flow passage (a) and/or the downstream flow passage (d). In some embodiments, the gas concentration meter is configured to measure a concentration of the gas component and/or the vaporized liquid component in the flow passage(s).

The one or more controllers (c) can be further configured. In some embodiments, the one or more controllers are further configured to cause flow of the gas component from the source and of the gas mixture to a process reactor to initiate a reaction. In other embodiments, the one or more controllers are further configured to cause the bubbler to maintain the liquid at a substantially constant temperature and/or a substantially constant pressure during a reaction; and/or to control the temperature and the pressure of the atmosphere in the bubbler during a reaction. In yet other embodiments, the one or more controllers are further configured to control a flow rate of the gas component and/or the gas mixture through the bubbler.

In a third aspect, the present disclosure features a system including any apparatus herein. In some embodiments, the system includes: a source configured to provide a process gas; one or more reactors or modules configured to conduct a semiconductor process, wherein at least one reactor or module further includes an inlet; an apparatus (e.g., any described herein) fluidically coupled to the source and at least one reactor or module; and one or more controllers configured to cause the source to deliver the process gas to the apparatus. In some embodiments, the process gas includes acetylene or a gas component.

In some embodiments, the apparatus is configured to provide a gas mixture (e.g., a gas mixture including a gas component and a vaporized liquid component). In other embodiments, the apparatus further includes an upstream flow passage that is fluidically coupled directly or indirectly to the source; and a downstream flow passage is fluidically coupled directly or indirectly to the inlet of the at least one reactor or module. Further aspects of apparatuses are described herein.

In some embodiments, the one or more controllers are further configured to cause a bubbler of the apparatus to transport the gas mixture to the at least one reactor or module prior to conducting the semiconductor process. Further aspects of controllers are described herein.

In particular embodiments, the at least one reactor or module is a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, or any other described herein.

In a fourth aspect, the present disclosure features a method of controlling a concentration of a vaporized liquid component. In some embodiments, the method includes: transporting a gas component from a source to a bubbler; passing the gas component through a liquid in the bubbler to form a gas mixture; and further transporting the gas mixture to a first reactor for conducting the reaction. In particular embodiments, the gas mixture includes the gas component and the vaporized liquid component at a substantially constant concentration value (e.g., a substantially constant concentration value of the vaporized liquid component within the gas mixture).

In some embodiments, the gas mixture includes the gas component and the vaporized liquid component, and the vaporized liquid component includes the liquid in vapor form. In particular embodiments, the bubbler includes a chamber for holding the liquid under conditions having a controlled temperature and pressure. In other embodiments, the bubbler is configured to maintain the concentration of the vaporized liquid component in the gas mixture leaving the bubbler at a substantially constant concentration value over a course of a reaction that reacts the gas mixture In some embodiments, said transporting the gas component includes transporting a stabilizer with the gas component from the source to the bubbler, wherein the source includes the gas component and the stabilizer. In other embodiments, said passing the gas component further includes the liquid being the stabilizer and the concentration of the stabilizer being at the substantially constant concentration value, wherein an initial concentration value of the stabilizer within the source is less than or greater than the substantially constant concentration value of the stabilizer in the gas mixture leaving the bubbler.

In other embodiments, the method further includes (e.g., at any time after said transporting the gas component): determining a first level of the liquid in the chamber of the bubbler, wherein the first level is determined with a liquid level sensor fluidically coupled to the bubbler or the chamber of the bubbler. In yet other embodiments, the method further includes (e.g., after said determining a first level): delivering an additional liquid to the chamber of the bubbler, if the first level is below a predetermined liquid level. In some embodiments, the method further includes (e.g., after said determining a first level): removing an excess of the liquid from the chamber of the bubbler, if the first level is above a predetermined liquid level.

In some embodiments, the method further includes (e.g., prior to said passing the gas component): adjusting a pressure that is determined either upstream or downstream of the bubbler. In particular embodiments, said adjusting the pressure includes adjusting by about 50 Torr to about 200 Torr to provide a change of the substantially constant concentration value by about 0.1 vol. % to about 5 vol. % (e.g., about 0.1 vol. % to 1 vol. %, 0.1 vol. % to 3 vol. %, 0.2 vol. % to 1 vol. %, 0.2 vol. % to 3 vol. %, 0.2 vol. % to 3 vol. %, 0.4 vol. % to 1 vol. %, 0.4 vol. % to 3 vol. %, 0.4 vol. % to 5 vol. %, as well as about ±0.1 vol. %, ±0.2 vol. %, ±0.5 vol. %, ±0.8 vol. %, ±1 vol. %, ±1.2 vol. %, ±1.5 vol. %, ±1.8 vol. %, ±2 vol. %, ±2.5 vol. %, ±3 vol. %, or ±5 vol. %).

In some embodiments, the method further includes (e.g., at any time after said transporting a gas component): adjusting a flow rate of the gas component from the source to the bubbler or a flow rate of the gas mixture from the bubbler to the first reactor. Non-limiting adjustments in flow rate can be from about 0.1 slm to about 20 slm (e.g., about 0.1 slm to 1 slm, 0.1 slm to 2 slm, 0.1 slm to 5 slm, 0.1 slm to 10 slm, 0.5 slm to 1 slm, 0.5 slm to 2 slm, 0.5 slm to 5 slm, 0.5 slm to 10 slm, 0.5 slm to 20 slm, 1 slm to 2 slm, 1 slm to 5 slm, 1 slm to 10 slm, 1 slm to 20 slm, 2 slm to 5 slm, 2 slm to 10 slm, 2 slm to 20 slm, 4 slm to 5 slm, 4 slm to 10 slm, 4 slm to 20 slm, 8 slm to 10 slm, or 8 slm to 20 slm).

In some embodiments, the method further includes (e.g., after said passing the gas component): delivering a push gas to a headspace in the chamber of the bubbler, wherein the gas mixture includes the gas component, the vaporized liquid component, and the push gas for said further transporting the gas mixture. Non-limiting push gas can include acetylene, oxygen, nitrogen, argon, a carrier gas, an inert gas, or any combination thereof In some embodiments, said further transporting the gas mixture includes further transporting the gas mixture within a defined pressure range and/or a defined mass flow rate range. In other embodiments, said further transporting the gas mixture includes further transporting the gas mixture to a second reactor, wherein the second reactor may or may not be fluidically coupled to the first reactor and wherein the second reactor may or may not be configured to conduct a reaction. In particular embodiments, the second reactor is for conducting a semiconductor process, and the substantially constant concentration value is maintained over a course of the semiconductor process.

In some embodiments, the method further includes (after said further transporting the gas mixture): initiating the reaction within the first reactor, wherein the bubbler continues to maintain the liquid at a substantially constant temperature and/or a substantially constant pressure during the reaction. In other embodiments, the bubbler continues to control the temperature and/or the pressure of an atmosphere in the bubbler during the reaction.

In any embodiment herein, the source includes a gas component (e.g., acetylene, oxygen, nitrogen, argon, a carrier gas, an inert gas, or any combination thereof). In other instances, the source further includes a stabilizer (e.g., any described herein).

In any embodiment herein, the source that is configured to be fluidically coupled to the upstream flow passage is a pressurized tank. In particular embodiments, the pressurized tank can be fluidically coupled to a pressure regulator. In some embodiments, the source includes a gas component (e.g., any described herein). In other embodiments, the source includes acetylene and an acetylene stabilizer (e.g., any described herein).

In any embodiment herein, a gas or a gas component includes acetylene, oxygen, nitrogen, argon, a carrier gas, an inert gas, or any combination thereof.

In any embodiment herein, the vaporized liquid component includes acetone, N,N-dimethyl formamide, a stabilizer, a precursor, or any combination thereof, in vapor form.

In any embodiment herein, the substantially constant concentration value is a saturation concentration of a vaporized liquid component in a gas mixture or a gas component at a controlled temperature and pressure of the atmosphere in the bubbler. In some embodiments, the vaporized liquid component is an acetylene stabilizer, the gas mixture includes acetylene and the acetylene stabilizer, and the substantially constant concentration value is a saturation concentration of the acetylene stabilizer in the gas mixture. In some embodiments, the substantially constant concentration value of the vaporized liquid component (e.g., an acetylene stabilizer) is less than an initial concentration value of the vaporized liquid component within a source (e.g., of the acetylene stabilizer within the source of acetylene and an acetylene stabilizer). In other embodiments, the substantially constant concentration value of the vaporized liquid component (e.g., an acetylene stabilizer) is greater than an initial concentration value of the vaporized liquid component within a source (e.g., of the acetylene stabilizer within the source of acetylene and an acetylene stabilizer).

In any embodiment herein, the substantially constant concentration value is about 0.1 vol. % to about 20 vol. % of a vaporized liquid component in a gas component (e.g., from about 0.1 vol. % to 1 vol. %, 0.1 vol. % to 3 vol. %, 0.1 vol. % to 5 vol. %, 0.1 vol. % to 10 vol. %, 0.1 vol. % to 15 vol. %, 0.2 vol. % to 1 vol. %, 0.2 vol. % to 3 vol. %, 0.2 vol. % to 5 vol. %, 0.2 vol. % to 10 vol. %, 0.2 vol. % to 15 vol. %, 0.2 vol. % to 20 vol. %, 0.4 vol. % to 1 vol. %, 0.4 vol. % to 3 vol. %, 0.4 vol. % to 5 vol. %, 0.4 vol. % to 10 vol. %, 0.4 vol. % to 15 vol. %, 0.4 vol. % to 20 vol. %, 0.5 vol. % to 1 vol. %, 0.5 vol. % to 3 vol. %, 0.5 vol. % to 5 vol. %, 0.5 vol. % to 10 vol. %, 0.5 vol. % to 15 vol. %, 0.5 vol. % to 20 vol. %, 0.8 vol. % to 3 vol. %, 0.8 vol. % to 5 vol. %, 0.8 vol. % to 10 vol. %, 0.8 vol. % to 15 vol. %, 0.8 vol. % to 20 vol. %, 1 vol. % to 3 vol. %, 1 vol. % to 5 vol. %, 1 vol. % to 10 vol. %, 1 vol. % to 15 vol. %, 1 vol. % to 20 vol. %, 3 vol. % to 5 vol. %, 3 vol. % to 10 vol. %, 3 vol. % to 15 vol. %, 3 vol. % to 20 vol. %, 5 vol. % to 10 vol. %, 5 vol. % to 15 vol. %, 5 vol. % to 20 vol. %, 10 vol. % to 20 vol. %, or 10 vol. % to 20 vol. % of the vaporized liquid component in the gas component). In some embodiments, the substantially constant concentration value is about 2 vol. % to about 10 vol. % of the acetylene stabilizer in acetylene. In some embodiments, the acetylene stabilizer is selected from the group consisting of acetone, N,N-dimethyl formamide, and any combination thereof. In particular embodiments, the acetylene stabilizer is acetone.

In any embodiment herein, the bubbler is configured to maintain a liquid, during operation, at a temperature of between about −20° C. and about 20° C. (e.g., about −15° C. to 15° C., −10° C. to 10° C., or −5° C. to 5° C.). In some embodiments, the bubbler is configured to maintain the atmosphere, during operation, at a pressure of between about 500 Torr and about 1100 Torr (e.g., about 500 Torr to 900 Torr, 500 Torr to 1000 Torr, 600 Torr to 900 Torr, 600 Torr to 1000 Torr, 600 Torr to 1100 Torr, 700 Torr to 900 Torr, 700 Torr to 1000 Torr, 700 Torr to 1100 Torr, 900 Torr to 1000 Torr, or 900 Torr to 1100 Torr). In other embodiments, the bubbler is configured to provide a flow rate between about 1 slm to about 20 slm (e.g., about 1 slm to 5 slm, 1 slm to 10 slm, 1 slm to 15 slm, 3 slm to 5 slm, 3 slm to 10 slm, 3 slm to 15 slm, 3 slm to 20 slm, 5 slm to 10 slm, 5 slm to 15 slm, or 5 slm to 20 slm).

In any embodiment herein, the bubbler includes a plurality of trays. In other embodiments, the bubbler includes a liquid level sensor (e.g., a discrete level sensor or a continuous level sensor). In yet other embodiments, the bubbler is fluidically coupled to a liquid level sensor (e.g., a discrete level sensor or a continuous level sensor).

In any embodiment herein, the liquid (e.g., in a bubbler or within a chamber of a bubbler) is provided at said controlled temperature and pressure that is configured to be a substantially constant temperature and a substantially constant pressure. In other embodiments, the liquid (e.g., in a bubbler or within a chamber of a bubbler) is maintained near or at a predetermined liquid level.

In any embodiment herein, the liquid (e.g., in a bubbler or within a chamber of a bubbler) is selected from the group consisting of acetone, N,N-dimethyl formamide, a stabilizer, a precursor, or any combination thereof, in liquid form. In some embodiments, the liquid provides a vaporized liquid component, which includes acetone, N,N-dimethyl formamide, a stabilizer, a precursor, or any combination thereof, in vapor form.

In any embodiment herein, a source of the liquid (e.g., for the chamber of a bubbler) is fluidically coupled to the bubbler or to the chamber of the bubbler. In some embodiments, the source of the liquid further includes a liquid level sensor. In other embodiments, the source of the liquid is configured to maintain the liquid in the bubbler at or near a constant liquid level.

In any embodiment herein, a gas mixture (e.g., formed within the bubbler) includes a gas component and a substantially constant concentration value of a vaporized liquid component (e.g., any herein, such as vapor forms of one or more stabilizers, acetylene stabilizers, precursors, or combinations thereof).

In any embodiment herein, the downstream flow passage (d) is configured to be fluidically coupled to one or more reactors or additional chambers. In some embodiments, the one or more reactions or additional chambers are configured to receive a gas mixture (e.g., including a gas component and a vaporized liquid component; or including acetylene and an acetylene stabilizer).

In any embodiment herein, the vaporized liquid component (e.g., any herein, including an acetylene stabilizer) in the gas mixture leaving the bubbler includes a substantially constant concentration value over a course of a semiconductor process.

In any embodiment herein, the apparatuses, systems, and methods herein further include a pressure regulator fluidically coupled to the upstream flow passage (a). In some embodiments, the pressure regulator is configured to be fluidically coupled to the source.

In any embodiment herein, the apparatuses, systems, and methods herein further include a pressure controller fluidically coupled to the upstream flow passage (a), or the downstream flow passage (d), or both of the upstream and downstream flow passages (a, d). In some embodiments, the pressure controller is further configured to maintain a pressure of a gas mixture within a defined pressure range in the flow passage. In other embodiments, the gas mixture includes a gas component and a vaporized liquid component; or the gas mixture includes acetylene and an acetylene stabilizer. In yet other embodiments, the defined pressure range does not exceed 10 psig. In particular embodiments, the one or more controllers (c) are coupled to the pressure controller and configured to control the pressure controller.

In any embodiment herein, the apparatuses, systems, and methods herein further include a mass flow controller fluidically coupled to the upstream flow passage (a), or the downstream flow passage (d), or both of the upstream and downstream flow passages (a, d). In some embodiments, the mass flow controller is configured to maintain a mass flow rate of a gas mixture and/or a gas component within a defined mass flow rate range in the flow passage. In other embodiments, the gas mixture includes a gas component and a vaporized liquid component; or the gas mixture includes acetylene and an acetylene stabilizer. In particular embodiments, the one or more controllers (c) are coupled to the mass flow controller and configured to control the mass flow controller.

In any embodiment herein, the apparatuses, systems, and methods herein further include a gas concentration meter fluidically coupled to the upstream flow passage (a), or the downstream flow passage (d), or both of the upstream and downstream flow passages (a, d). In some embodiments, the gas concentration meter is configured to measure a concentration of a gas mixture, a gas component, and/or a vaporized liquid component in the flow passage. In particular embodiments, the one or more controllers (c) are coupled to the gas concentration meter.

In any embodiment herein, the apparatuses, systems, and methods herein further include a temperature controller coupled to the bubbler. In some embodiments, the temperature controller is configured to maintain a temperature of the gas mixture within a defined temperature range in the downstream flow passage (d). In other embodiments, the gas mixture includes a gas component and a vaporized liquid component; or the gas mixture includes acetylene and an acetylene stabilizer. In yet other embodiments, the defined temperature range does not exceed 30° C. In particular embodiments, the one or more controllers (c) are coupled to the temperature controller and configured to control the temperature controller.

In any embodiment herein, the apparatuses, systems, and methods herein further include a valve fluidically coupled to the bubbler and configured to deliver a push gas to a headspace in the chamber of the bubbler. In particular embodiments, the push gas can be any useful gas or gas component, e.g., acetylene, oxygen, nitrogen, argon, a carrier gas, an inert gas, or any combination thereof.

In any embodiment herein, the apparatuses, systems, and methods herein further include a valve fluidically coupled to the bubbler and configured to deliver an additional liquid to the chamber of the bubbler. In particular embodiments, the additional liquid includes the liquid present within the chamber or another liquid.

In any embodiment herein, the apparatuses, systems, and methods herein further include an exit pathway fluidically coupled to the bubbler and configured to remove an excess of the liquid in the chamber of the bubbler.

DETAILED DESCRIPTION

Figure 1A:
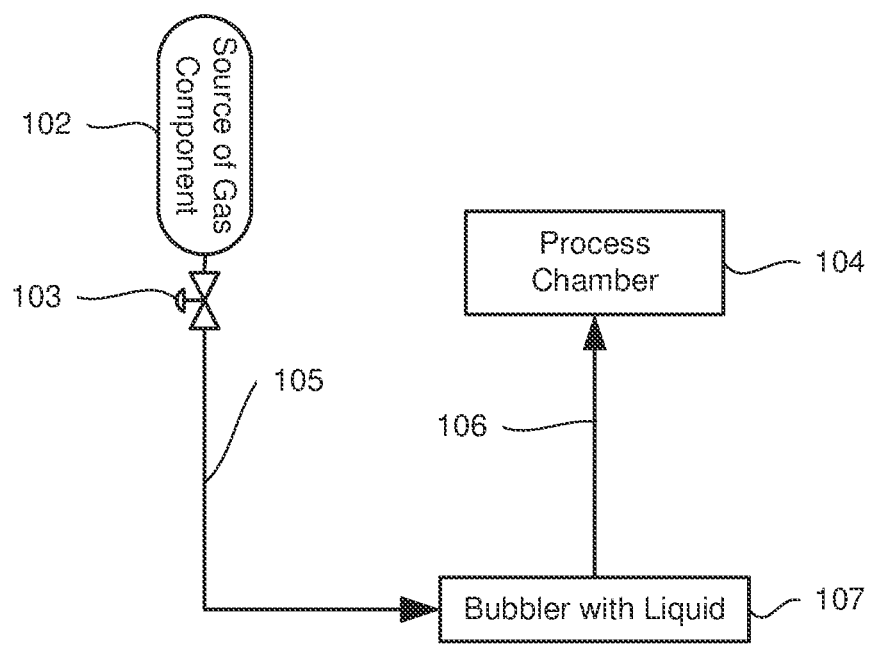
FIG. 1A-1B shows illustrative diagrams of non-limiting pre-processing modules for use with a processing reactor or module. Provided are (A) a pre-processing module fluidically coupled to a process chamber 104 and a source 102 having a pressure regulator 103, in which the pre-processing module includes an upstream flow passage 105, a bubbler 107 with liquid, and a downstream flow passage 106; and (B) a pre-processing module fluidically coupled to a deposition chamber 114.

The present disclosure relates, in part, to apparatuses and methods for controlling the concentration of a vaporized liquid component within a gas mixture. In particular embodiments, the vaporized liquid component is a stabilizer, a precursor, or any other component described herein. In use, the apparatus passes a gas component through a liquid, thereby allowing compounds within the liquid to mix with the gas component in vapor form. Thus, the resultant gas mixture includes the gas component and a vaporized liquid component. The apparatus can form a pre-processing module, which in turn can be fluidically coupled with a process chamber configured to perform one or more semiconductor processes, such as deposition or etch of a layer.

Control over the concentration of the vaporized liquid component within the gas mixture can be achieved by maintaining a certain temperature and pressure at equilibrium within the pre-processing module. Such conditions allow the output concentration of the vaporized liquid component to be maintained, regardless of the initial or input concentration of the vaporized liquid component. Without wishing to be limited by mechanism, pressure and temperature can be controlled within the apparatus, such that thermodynamic principles can be used to predict a steady saturation concentration of the vaporized liquid component at equilibrium. In this manner, the output concentration is maintained at a substantially constant concentration value over a course of any useful semiconductor process (e.g., a deposition reaction that reacts the gas).

In particular embodiments, the pre-processing module includes a chamber for holding the liquid that will be vaporized and mixed with the gas component. Generally, the chamber is within a bubbler. As used herein, an upstream flow passage is generally in a flow pathway before reaching the bubbler, thus a gas stream within the upstream flow passage typically includes the gas component as provided by a source of the gas component. In contrast, a downstream flow passage is generally in a flow pathway after reaching the bubbler, thus a gas stream within the downstream flow passage typically has passed through the liquid within the bubbler's chamber.

The apparatus can also include a bypass pathway, which directly connects the upstream and downstream flow passages and, therefore, bypasses the bubbler. If the bypass pathway is opened (e.g., completely or partially opened), then a gas stream within the downstream flow passage may include a combination of a gas from the source with a portion of gas that has been passed through the bubbler, as dictated by the type of valves, controllers, and pressure/flow conditions present within the apparatus. For instance, if the bypass pathway is partially opened, then the gas mixture provided to a process chamber can include the gas component from the source with another gas stream that is enriched with the vaporized liquid component.

The present disclosure also relates to methods of controlling concentration with controlled temperature and pressure conditions. In particular embodiments, the methods employ a bubbler, as described herein, for adjusting the concentration of the vaporized liquid component in the gas component flowing into the bubbler. Methods can also include determining a level of the liquid in the bubbler, adding or removing liquid from the bubbler, and adjusting one or more of flow rate, pressure, and/or temperature within the bubbler or fluidically coupled flow passages.

The present disclosure also relates to systems, in which an apparatus is employed as a pre-processing module to deliver a gas mixture for semiconductor processing. In one instance, the pre-processing module is fluidically connected between a source and a semiconductor processing reactor or module. The source can provide the gas component to be modified by the pre-processing module, and the semiconductor processing reactor or module can include one or more chambers configured to receive the gas mixture for performing one or more semiconductor processes. Additional details follow.

Pre-Processing Modules for Providing Gas Components, Including Acetylene

The present disclosure relates to an apparatus that can be employed as a pre-processing module. FIG. 1A shows such a module fluidically coupled to a process chamber 104. The pre-processing module can be configured to be fluidically coupled to a source 102 of a gas component having a pressure regulator 103 and to be fluidically coupled to a process chamber 104. The pre-processing module itself can include a processing line 105 forming the upstream flow passage, a bubbler 107 with liquid, and another processing line 106 forming the downstream flow passage. The gas component is discharged from the source 102 and passed through the pressure regulator 103. The gas component is then passed through a processing line 105 and into the bubbler 107, in which the gas interacts with a liquid in the bubbler 107 to provide a gas mixture having a vaporized liquid component.

In use, the bubbler 107 maintains the liquid and a headspace above the liquid under an atmosphere having a controlled temperature and pressure. By exerting such control, thermodynamic principles can affect the extent of saturation of the vaporized liquid component within the gas mixture being passed through the liquid and within the gas mixture in the headspace above the liquid. As the gas component passes through the liquid, a controlled concentration of the vaporized liquid is carried with the gas component to form a gas mixture. This controlled concentration is predicted to be a substantially constant and steady saturation concentration. In this way, the gas mixture includes a steady concentration of the vaporized liquid when exiting the bubbler 107 and into another processing line 106, which serves as the downstream flow passage and is fluidically coupled to a process chamber 104.

Various semiconductor processes could benefit from such control over concentration of vaporized liquid components. Such control can be provided to processes conducted in a single reactor, a single module, a plurality of reactors, or a plurality of modules for semiconductor process(es). In this way, a single pre-processing module can be fluidically coupled to a single processing module or processing reactor, as well as to a plurality of processing reactors or processing modules. In addition, such control can be provided during a course of any process in which concentration control of a gas or a gas mixture can be useful, such as during a course of a deposition reaction, substrate processing reaction, an etch reaction, an implantation reaction, etc.

In one instance, the concentration of a vaporized precursor provided to a process chamber can directly affect the quality and thickness of the deposited film. Here, the pre-processing module can be used to deposit a film or a layer on a substrate, and the vaporized liquid component includes a vaporized precursor for such deposition. In this embodiment, the gas component can be an inert gas (e.g., argon) or a non-inert gas (e.g., oxygen); and the source for the gas component can be a cylinder, a tank, or a facility wide supply of the gas.

In another instance, the pre-processing module can be used to deposit a high carbon content material (e.g., as in an ashable hardmask). In this embodiment, the gas component can be acetylene, which is the carbon source for deposition; and the vaporized liquid component is an acetylene stabilizer. Acetylene can begin to decompose at pressures above 15 psig. Given acetylene's propensity to violently decompose, acetylene cylinders are supplied with safety pressure regulators that limit the pressure in receiving lines to 15 psig. However, the overhead pressure inside the cylinder may exceed 200 psi when used with safety devices. Considering that deposition chambers are usually operated at low pressures, 15 psig or less is a sufficiently high driving pressure to flow an acetylene gas stream through a pre-process module and into a deposition chamber. As an example, a deposition process may employ a flow rate of about 6750 standard cubic centimeters per minute (sccm) (6.75 L/min), while the deposition chamber is maintained at about 8 Torr. As discussed herein, flow rates and chamber pressures may vary depending on process requirements.

In certain embodiments, the acetylene source is a cylinder that contains a filler material and stabilizer in addition to the safety relief devices. In certain embodiments, standard-sized hollow steel cylinders that are conventionally used for compressed gas service are used for acetylene. In certain embodiments, ganged cylinders, i.e., cylinders connected to a common gas line, can be used.

While the acetylene source may be a bottle or cylinder, it may also be a tank or a facility wide supply of acetylene (e.g., an acetylene resource plumbed into the facility). The concentration of acetone or other acetylene stabilizers in the acetylene gas stream can vary substantially depending on the ratio of acetylene to stabilizer in the storage cylinder. Typically, the acetone content in the acetylene gas stream tends to increase as more acetylene is used from the cylinder. This presents a particular difficulty when using acetylene in processes where acetone, and particularly the relative amount of acetone in the acetylene, impacts the quality of the resulting product. N,N-dimethyl formamide (DMF)-stabilized acetylene can provide a near constant amount of stabilizer in the acetylene gas stream, but DMF is sometimes avoided in processing applications due to its toxicity and/or higher cost.

Figure 1B:
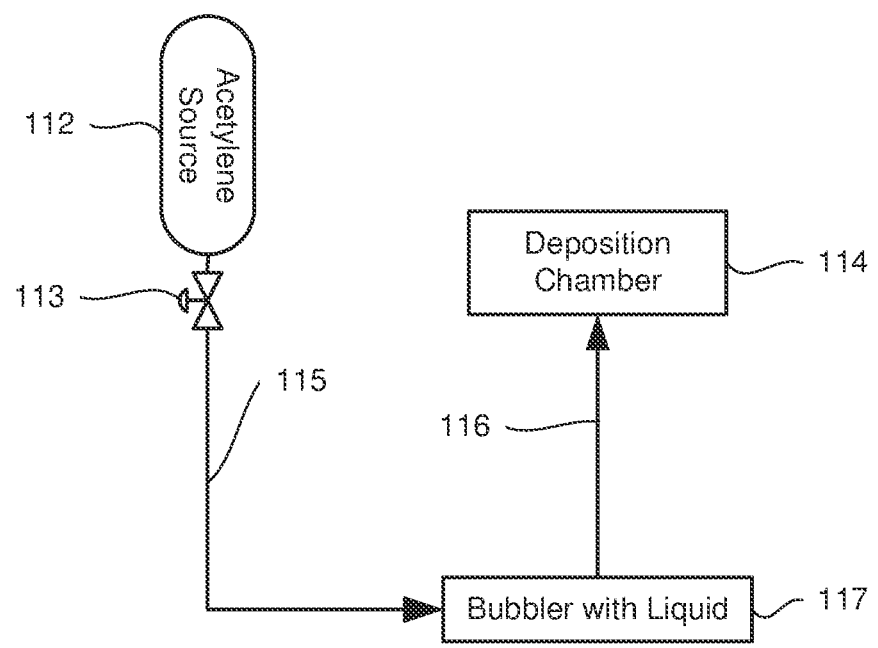

FIG. 1B is a block diagram depicting an example of a pre-processing module that employs acetylene. The pre-processing module can be configured to be coupled to a deposition chamber 114, which can employ acetylene as the carbon source for a deposition reaction. As can be seen, the pre-processing module employs an acetylene source 112 having a corresponding pressure regulator 113, which in turn is connected to the deposition chamber 114. The acetylene source contains acetylene and a stabilizer. In certain embodiments, the acetylene source is pressured to over about 200 psi.

When the acetylene gas stream is discharged from the acetylene source, it first passes through the pressure regulator 113, where the service pressure of the cylinder is reduced to a safe level below about 15 psig. The acetylene is then passed via a processing line 115 serving as the upstream flow passage, into the bubbler 117 with liquid, through another processing line 116 serving as the downstream flow passage, and into the deposition chamber 114. Suitable materials for the processing lines 115, 116 include steel and wrought iron. Generally, cast iron, unalloyed copper, silver, or mercury are avoided because of possibility of forming explosive acetylides.

The acetylene gas stream in the processing line may include some stabilizer vapor in addition to acetylene. The stabilizer volumetric concentration in the upstream flow passage may be in range of about 0.5 vol. % to about 20 vol. %, depending on the current service pressure of the acetylene cylinder. The temperature of the acetylene gas stream in the line depends on the storage conditions of the acetylene cylinder, evaporation rate and other factors.

In some embodiments, the stream may be passed through a bubbler 117 to provide a gas mixture (including acetylene and an acetylene stabilizer) at a desired concentration value (e.g., at a substantially constant concentration value of the stabilizer over a course of a deposition reaction). This desired concentration value, after passing through the bubbler, can be greater than or less than the stabilizer concentration in the acetylene provided by the source. For instance, at the beginning of service, the acetylene cylinder may be stabilizer-starved, in which vaporized stabilizer may need to be added to the acetylene stream. In another instance, at the end of service, the acetylene cylinder may be stabilizer-rich, in which vaporized stabilizer may need to be removed from the acetylene stream. By employing a bubbler, the addition and removal of stabilizer can be accomplished because the saturation concentration of the stabilizer within the acetylene stream can be predicted for an apparatus that is at equilibrium and that possesses controlled temperature and pressure conditions.

In certain embodiments, the stream may be passed through a temperature controller to regulate the temperature of the acetylene and the stabilizer during deposition. In certain embodiments, the temperature controller (e.g., heat exchanger) can maintain the temperature of the acetylene gas stream between about 10° C. and 50° C. In some cases, the temperature is maintained between about 15° C. and 30° C. In certain embodiments, the apparatus does not include a heat exchanger on the path between acetylene source 112 and bubbler 117. In some implementations, to the extent that temperature of the acetylene and stabilizer mixture is controlled, this is accomplished while acetylene is present in the bubbler. Optionally, the gas mixture (after the bubbler) can be heated prior to entry into the deposition chamber. Such heating is optional and may not be necessary based on the processing conditions employed, e.g., a sufficient travel time or travel length (e.g., more than about 1 ft per 1 slm) of the gas from the bubbler to the deposition chamber that allows for passive heating of the gas.

The system is configured so that the acetylene gas stream then flows into the deposition chamber 114. The system may be configured to include a flow controller, such as a mass flow controller (MFC), through which the acetylene mixture passes on the way to deposition chamber 114. The MFC may be calibrated relative to specific ranges for the properties of the reduced stabilizer concentration acetylene gas stream, such as temperature, composition, pressure, desired flow rate, and others. The MFC may be fitted with a closed loop control system which is given an input signal by the operator or an external system, wherein the input value is compared to a value from the mass flow sensor and a valve of the MFC is adjusted accordingly to achieve the required flow rate.

Finally, the system is configured so that the acetylene gas stream flows into the deposition chamber 114. An example of the deposition chamber 114 is described in the context of FIG. 7. The acetylene gas stream may be used as a carbon-containing precursor that is used to form a layer of high carbon content material on a semiconductor substrate during fabrication of an electronic device. This process is performed in the deposition chamber 114.

Figure 2A:
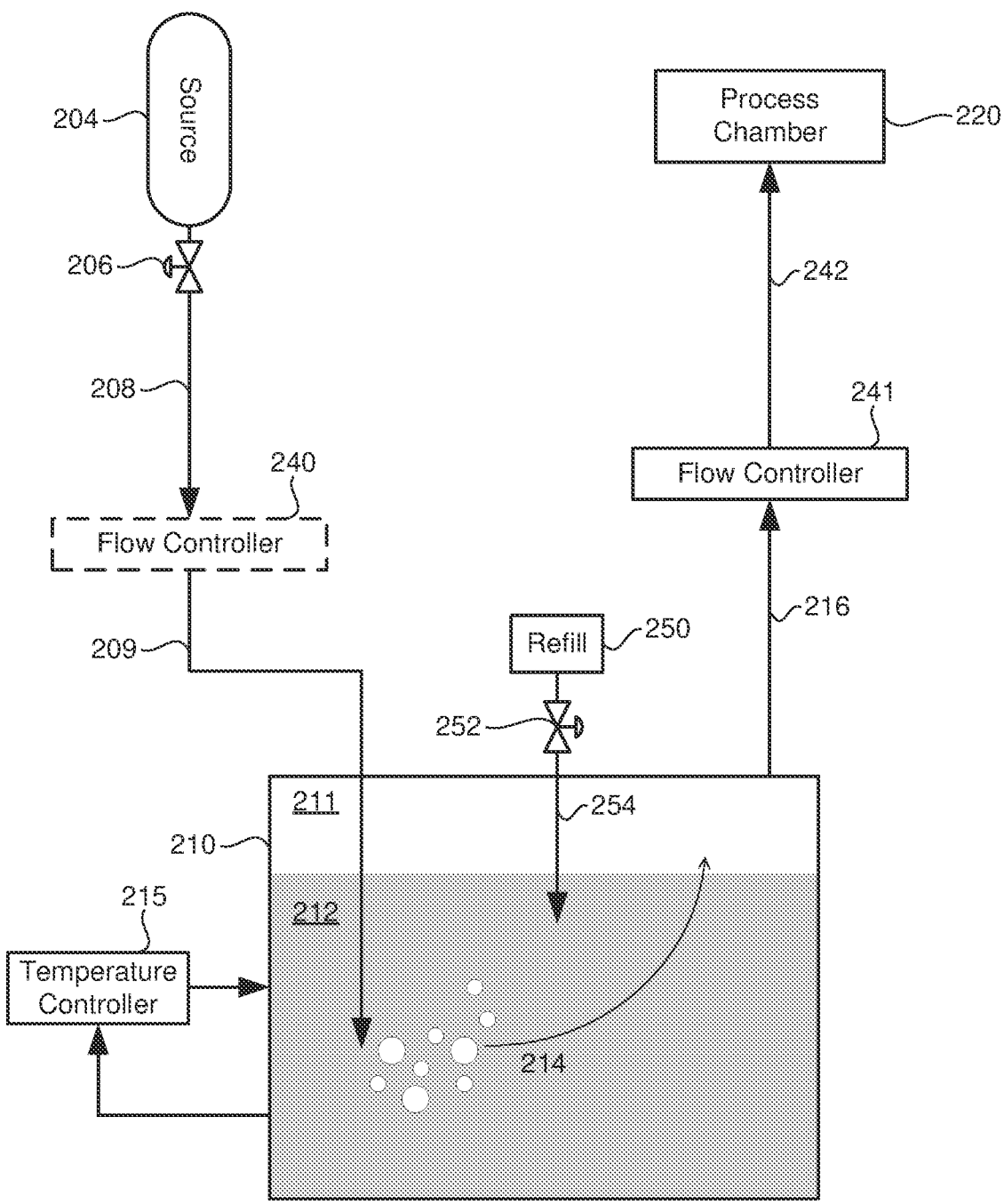
FIG. 2A-2C shows illustrative schematics of non-limiting bubbler configurations in a pre-processing module. Provided are (A) a bubbler having a refill source 250 for adding to the liquid 212, in which the pre-processing module can include an upstream flow controller 240 and/or a downstream flow controller 241; (B) a bubbler having a refill or push gas source 250 for adding to the headspace 211; and (C) a bubbler having an upstream pressure controller 260 and/or a downstream pressure controller 261, in place of a flow controller.
Figure 2B:
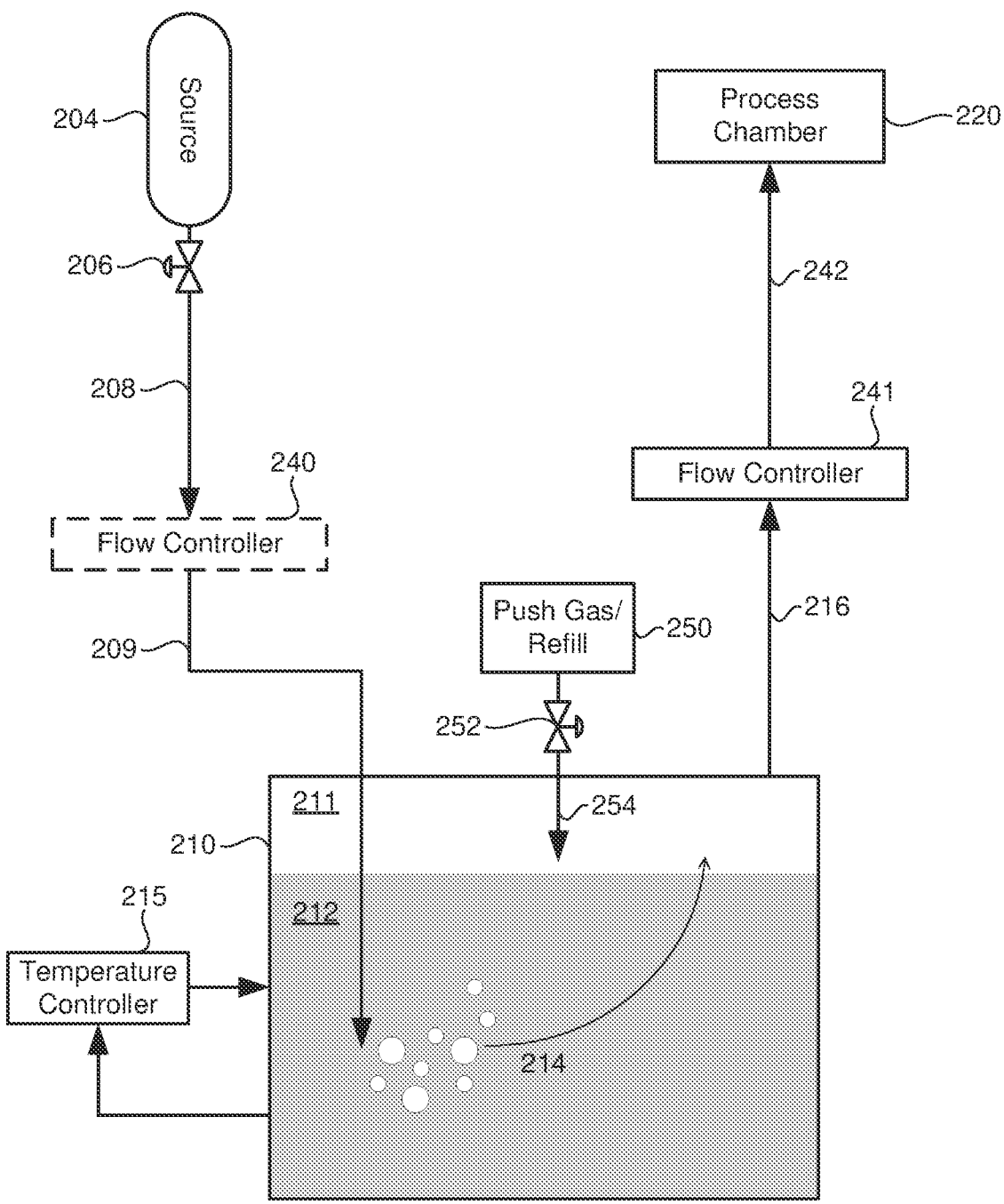
Figure 2C:
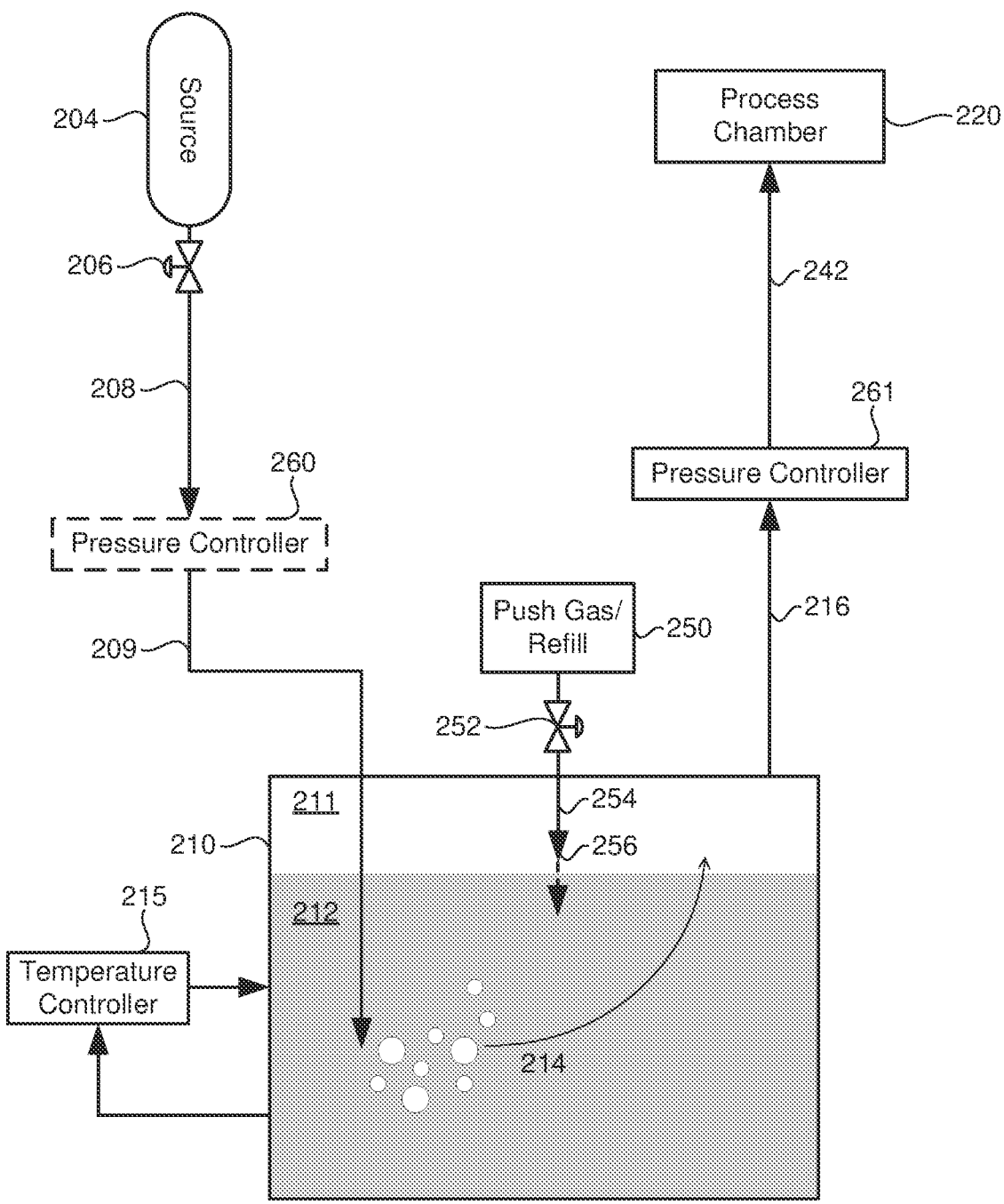

FIG. 2A-2C presents a simple block diagram depicting a pre-processing module having a bubbler 210. The pre-processing module can be configured to be fluidically coupled to a source 204 of a gas component with a corresponding pressure regulator 206 in a manner that is upstream of the bubbler 210, as well as configured to be fluidically coupled to a process chamber 220 downstream of the bubbler. The source 204 can contain a gas component (e.g., acetylene, an inert gas, or a non-inert gas). When acetylene in employed, the source can also include a stabilizer. In certain embodiments, the source 204 is pressured to over 200 psi. The source may be a tank or a facility wide supply of a gas component (e.g., a gas resource plumbed into the facility). In some embodiments, the source 204 is an acetylene cylinder, such as described above, that contains a filler material and the safety relief devices.

When the gas stream is discharged from the source 204 by way of an upstream flow passage, it first passes through the pressure regulator 206 where the service pressure of the cylinder is reduced to a safe level, e.g., below about 15 psig. The gas component is then passed through processing lines 208, 209 and into a bubbler 210. Additional configurations for bubblers are described herein.

Figure 8:
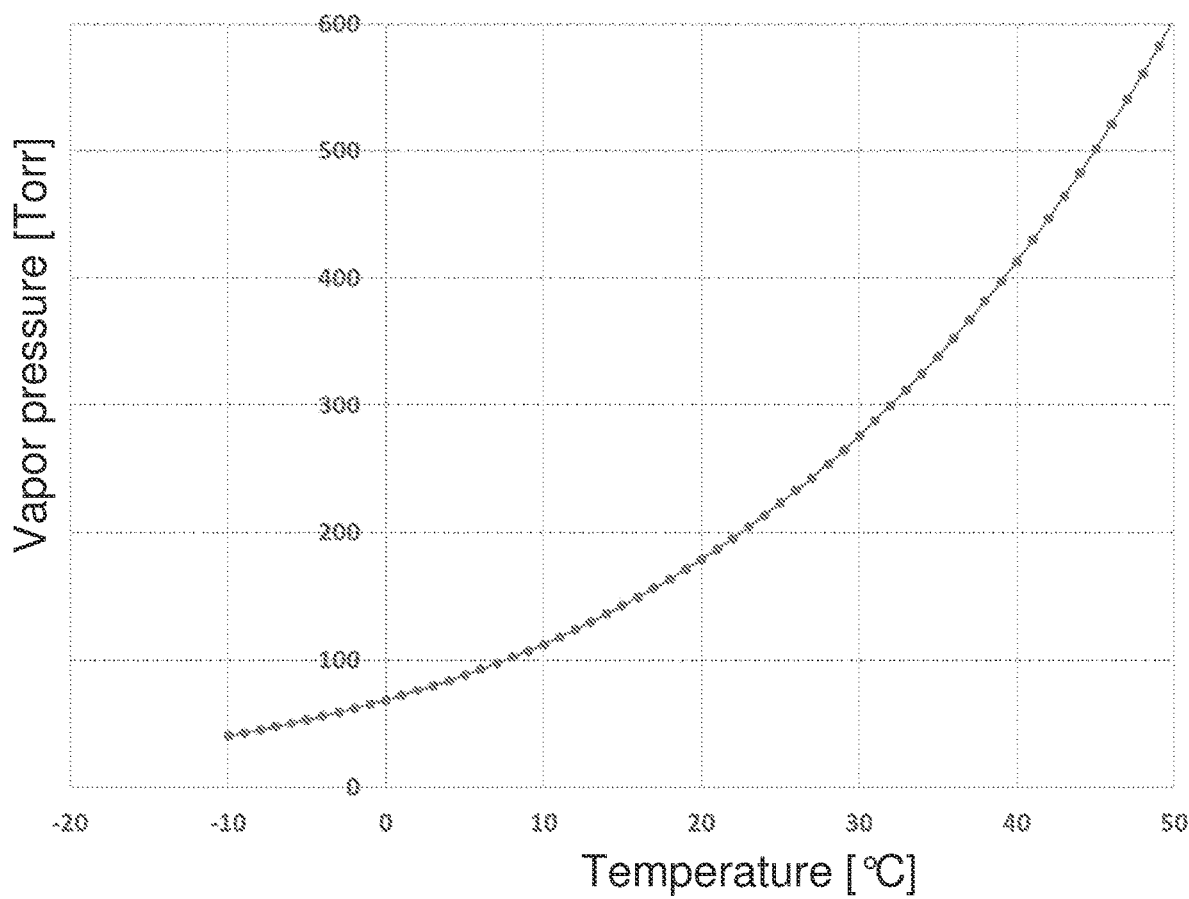
FIG. 8 shows an illustrative pressure-temperature graph for acetone.

In some embodiments, the bubbler 210 includes a chamber holding a liquid 212 and having a headspace 211 disposed above the liquid, and the processing lines 208, 209 serve as an inlet for the acetylene gas stream into the liquid 212. The liquid 212 can be any useful compound, such as an acetylene stabilizer (e.g., acetone, for which a pressure-temperature graph is shown in FIG. 8) or a precursor.

When acetylene is employed, the acetylene gas stream in the processing lines 208, 209 may include some stabilizer vapor in addition to acetylene. As an example, the stabilizer concentration in the processing line may be in a range of about 0.5 vol. % to 20 vol. %, depending on the current service pressure of the acetylene cylinder. The temperature of the acetylene gas stream in the lines 208, 209 depends on the storage conditions of the acetylene cylinder, evaporation rate, and other factors.

By passing the gas stream through the liquid 212, a modified gas mixture 214 can be transported into the headspace 211, which is connected to a downstream flow passage connected to an outlet of the bubbler 210. The concentration of the vaporized liquid in the headspace can be a steady state concentration that is dependent on temperature and pressure. Accordingly, the gas mixture leaving the bubbler 210 through a downstream flow passage that includes a processing line 216 has a steady state stabilizer concentration, such as in the range of less than about 10 vol. % or about 1 vol. % to 5 vol. %. This concentration may remain substantially constant over the course of processing a substrate or a series of substrates, such as a batch of substrates. In particular non-limiting embodiments, a substantially constant concentration can have a variation that is less than about 2%, 1.5%, 1%, 0.9%, 0.8%, 0.7%, 0.6%, 0.5%, or 0.3%.

Furthermore, the liquid 212 and/or headspace 211 of the chamber can be fluidically connected to a refill source 250, which can either provide a liquid for the chamber or a gas for the headspace. The refill line 254 (having an optional pressure regulator 252) can be inserted into the liquid 212 as in FIG. 2A or into the headspace 211 as in FIG. 2B.

The bubbler 210 can be connected to a temperature controller 215. In one embodiment, the temperature controller 215 can be a chiller containing a coolant. For example, the coolant may comprise ethylene glycol and water, but other coolants may also be used. For example, Dynalene HF-LO (aliphatic hydrocarbon), Dynalene MV (hydrocarbon blend), Syltherm XLT may be used. The bubbler may be fluidically connected to any number of temperature controllers. The number and the design of the temperature controller depends on the flow rates in the processing lines 208, 209, the required concentration of the vaporized liquid in the exit line 216, various design parameters of the bubbler 210, and other factors.

The bubbler alone can be operated to control the concentration of the stabilizer in the incoming gas stream from the source. Depending on the process requirements and condition of the acetylene source, a certain amount of stabilizer may need to be removed from a chamber of the bubbler, and condensed stabilizer may be removed from the chamber by way of an exit pathway, as described herein.

By controlling conditions in the bubbler 210, the gas mixture flowing into the exit line 216 can be at the desired steady state concentration (e.g., a substantially reduced or increased concentration in the acetylene gas stream, as compared to the stabilizer concentration in the processing line 208, 209). Depending on the bubbler design and the residence time of the gas component in the bubbler, the temperature of this stream in the exit line 216 may be within a few degrees of the liquid temperature. Since many gas properties are dependent on the temperature and may affect operation of the mass flow controller 240 and impact processing in the process chamber 220, the stream can be first passed through a temperature controller (e.g., heater) upstream of the mass flow controller 240. Various heater types may be used. In certain embodiments, the heater can maintain the temperature of the gas stream between about 10° C. and 50° C. In one specific embodiment, the temperature is maintained between about 15° C. and 30° C.

The pre-processing module can include one or more flow controllers configured to maintain flow within the flow passages. In one embodiment, as seen in FIG. 2A-2B, the pre-processing module is configured such that the gas stream with steady state concentration of the vaporized liquid then flows through a downstream flow controller 241, e.g., a mass flow controller (MFC), before entry into the process chamber 220 via a processing line 242. The MFC may be calibrated relative to specific ranges for the properties of the gas stream, such as temperature, composition, pressure, desired flow rate, and others. The MFC may be fitted with a closed loop control system which is given an input signal by the operator or an external system, wherein the input value is compared to a value from the mass flow sensor and a valve of the MFC is adjusted accordingly to achieve the required flow rate.

Alternatively, the pre-processing module can include flow controllers in the upstream flow passage. As seen in FIG. 2A-2B, an optional upstream flow controller 240 can be positioned within the upstream flow passage, in which the gas stream flows from the source 204 via a first processing line 208, through the upstream flow controller 240, and then entry into the bubbler 210 via a second processing line 209. The choice of an upstream and/or a downstream flow controller can be determined by process conditions or controller abilities. Accordingly, in some embodiments, the module can include both upstream and downstream flow controllers, only an upstream flow controller, or only a downstream flow controller.

The pre-processing module can be configured to include one or more pressure controllers configured to maintain a pressure within a defined pressure range in the flow passage. As seen in FIG. 2C, the pre-processing module is configured such that the gas stream with steady state concentration of the vaporized liquid then flows through a downstream pressure controller 261 before entry into the process chamber 220 via a processing line 242. An optional upstream pressure controller 260 can be present to provide a gas stream from the source 204 via a first processing line 208, through the upstream pressure controller 260, and entry into the bubbler 210 via a second processing line 209. The choice of an upstream and/or a downstream pressure controller can be determined by process conditions or controller abilities. In some embodiments, the module can include both upstream and downstream pressure controllers, only an upstream pressure controller, or only a downstream pressure controller.

Finally, the gas stream flows into the process chamber 220 by any useful line 242. The pre-processing module may be designed to interface with a deposition chamber, an etch chamber, or any other described herein. This may involve providing it with specifically designed and/or selected flow tubes (including specific sizes, geometries and orientations) at the interface as well as specific fittings for direct coupling to the deposition chamber. Several types of fittings may be used for connecting the process chamber 220 to the bubbler 210. For example, Swagelok VCR Face-Seal fitting or Swagelok VCR tube fittings may be used for this interconnection. Other vacuum types and low-pressure gas connection types of fittings may be used. In some embodiments, the fittings may be specifically designed be compatible with semiconductor equipment and overall semiconductor processing. An example of a process chamber 220 is described in more details in the context of FIG. 7.

Figure 3A:
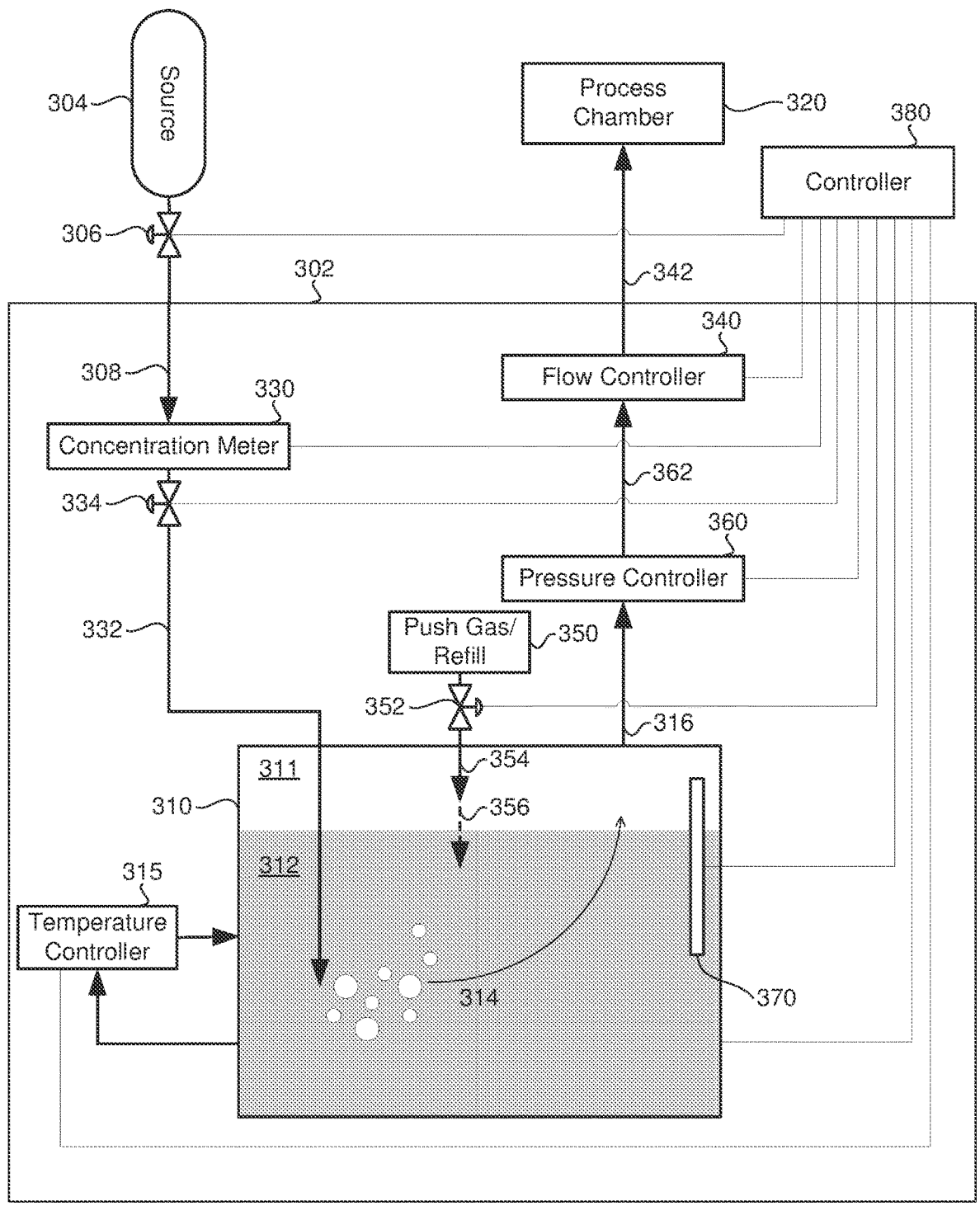
FIG. 3A-3E shows illustrative schematics of a system having a configured controller. Provided are (A) a system having a controller 380 configured to operate one or more components within a pre-processing module and to operate a valve 306 for the source 304; (B) a chamber for the bubbler 601 in use with a sensor that can be connected to a controller; (C) a process flow diagram detailing an algorithm to control an illustrative fill on demand bubbler; (D) a flow chart for an implementation of overfill protection for the bubbler; and (E) a flow chart for an implementation of low liquid level protection for the bubbler.

FIG. 3A is a schematic diagram of a controller configured to operate one or more components within a pre-processing module 302. The pre-processing module 302 can be configured to be employed with a source 304 to provide a gas component or a combination of acetylene with a stabilizer. The gas from the source 304 can be passed through a pressure regulator 306, into the processing line 308, and into a concentration meter 330. The concentration meter 330 can be employed to measure a concentration of the gas component in the upstream flow passage. From the concentration meter 330, the gas component can be passed through another pressure regulator 306, into the processing line 332, and into an inlet of a bubbler 310. As can be seen, the bubbler 310 can have a chamber holding a liquid 312 and containing a headspace 311 above the liquid 312. By passing the gas stream through the liquid 312, a modified gas mixture 314 can be transported into the headspace 311 to provide a gas mixture having a vaporized liquid component. A temperature controller 315 can be connected to the bubbler 310 to maintain a desired temperature, and a level detector 370 can be located within the bubbler 310 to track the level of the liquid.

To maintain the desired pressure or temperature within the bubbler, additional liquids or gases can be delivered via a refill line 354, 356. The refill line, in turn, can be connected to a pressure regulator 352 that is in fluidic communication with a refill source 350. The output of the refill line 354 can be inserted into the headspace 311, or the output of the refill line 356 can be inserted into the liquid 312 within the bubbler 310. The refill source 350 can include a liquid, such as an acetylene stabilizer or a precursor; or a gas, such as a push gas or an inert gas.

The amount of liquid within the bubbler can be monitored and/or controlled during operation to provide the liquid at or near a constant liquid level. In some instances, a liquid level sensor (e.g., a discrete level sensor or a continuous level sensor) is fluidically coupled to the bubbler or a chamber of the bubbler. A predetermined liquid level within the chamber can be selected (e.g., about 20% to 70% of the total fill volume of the chamber). If a liquid level in the chamber is below that predetermined level, then the chamber can be refilled with a liquid (e.g., up to that predetermined level). Conversely, if a liquid level in the chamber is above that predetermined level, then excess fluid can be removed from the chamber. Such removal can include condensing the liquid from the chamber. In other embodiments, the predetermined liquid level can be from about 30% to 50% of the total fill volume of the chamber.

In addition to temperature and pressure, residence time can be controlled within the pre-processing module. In one non-limiting instance, the residence time can be the amount of time that the gas mixture is flowing through the liquid within the bubbler. Such residence time can be sufficiently long enough to ensure equilibrium exchange between the liquid in the chamber and the gas mixture being passed through the liquid.

The liquid level in the chamber can be controlled by use of sensors to detect one or more levels of liquid within a chamber of the bubbler. In certain implementations, a single sensor senses two or more levels, and in still further embodiments, a single sensor senses three or more levels. Additional details are provided in FIG. 3B-3E, which are described elsewhere herein.

Turning again to FIG. 3A, the gas stream with steady state concentration of the vaporized liquid then flows from the processing line 316, through a pressure controller 360, into a further line 362 connected to a flow controller 340, and into a process chamber 320 via line 342. A controller 380 can be electronically connected to any component within this system. As can be seen in FIG. 3A, the controller can be configured to control the flow and/or concentration of one or more liquids or gases. In certain embodiments, the controller 380 is configured to be connected to a pressure regulator 306 of the source 304; a flow controller 340 fluidically coupled to a downstream flow passage, in which the controller is configured to maintain a mass flow rate within a defined range; a concentration meter 330 fluidically coupled upstream of the bubbler 310; a valve or pressure gauge 334 connected in proximity to the concentration meter; a pressure controller 360 fluidically coupled downstream of the bubbler 310; a valve or pressure gauge 352 fluidically connected to the push gas/refill source 350; a level detector 370 in communication with the bubbler 310; and/or a temperature controller 315 in proximity with the bubbler 310.

Figure 4A:
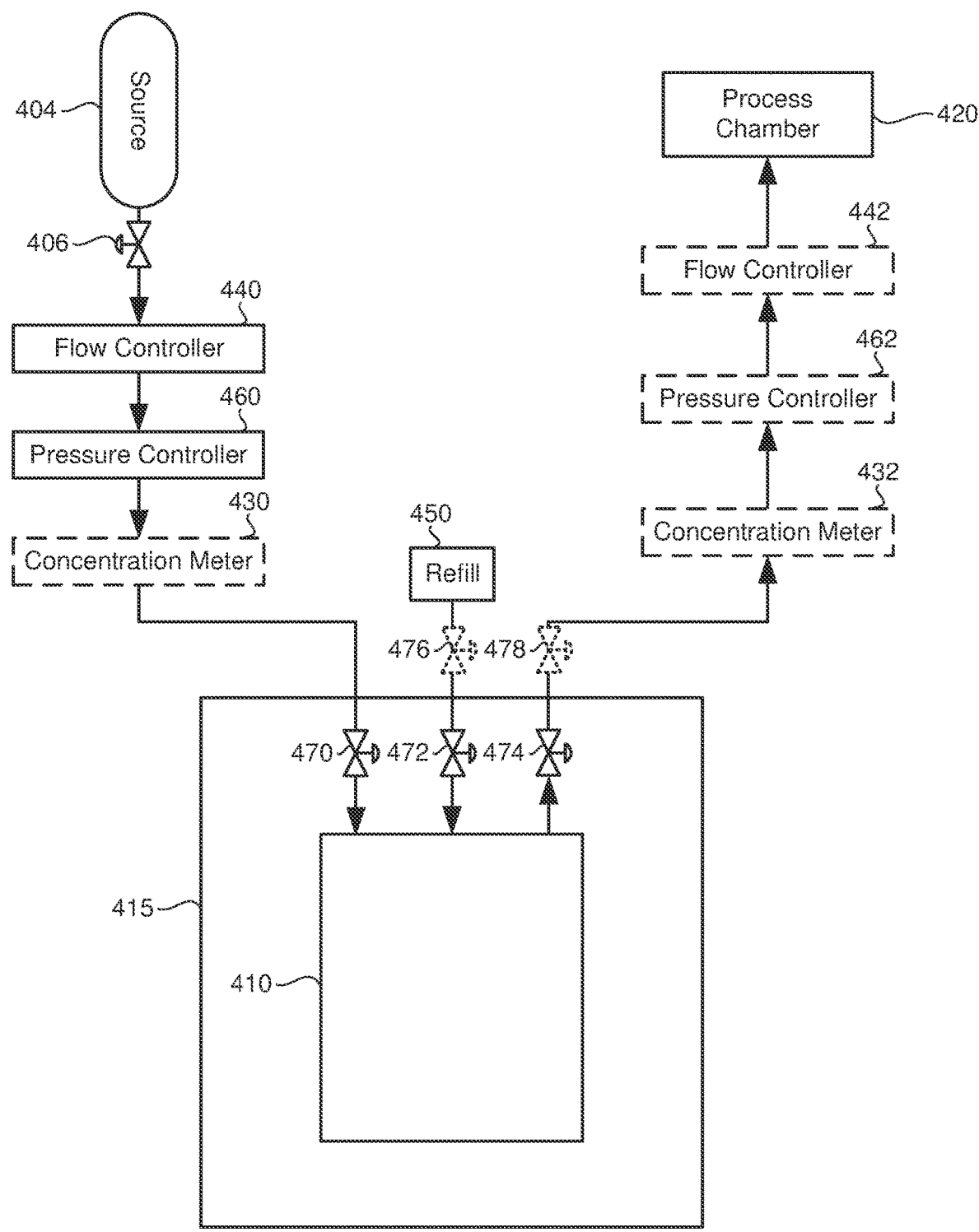
FIG. 4A-4F shows illustrative diagrams of non-limiting configurations for components within the pre-processing module. Provided are (A) a pre-processing module with possible locations for concentration meters 430, 432, flow controllers 440, 442, and pressure controllers 460, 462 in the upstream and/or downstream flow passages; (B) a pre-processing module with an upstream flow controller 440 (in an upstream flow passage) and a downstream pressure controller 462 (in a downstream flow passage); (C) a pre-processing module with a downstream flow controller 442 and a downstream pressure controller 462, in which an ampoule 484 containing a liquid is fluidically coupled to the bubbler 410; (D) a pre-processing module having a bypass pathway 490; (E) a pre-processing module having an exit pathway 495 configured to remove liquid from the bubbler 410; and (F) a pre-processing module including a particular combination of components and pathways.

FIG. 4A is a schematic diagram of a pre-processing module including various meters and controllers. As can be seen, the pre-processing module can be configured to be fluidically coupled to a source 404 with a corresponding pressure regulator 406 and to a process chamber 420. The pre-processing module can include a bubbler 410 and a temperature controller 415, which can be used to control the temperature of the bubbler 410. One or more pressure regulators 470, 472, 474 and optional pressure regulators 476, 478 can be employed to control the gas streams going into and out of the bubbler. In addition, a refill source 450 can be fluidically coupled to the bubbler 410 to deliver one or more additional gases or liquids.

One or more components can be included to measure and control the flow, pressure, and/or concentration of a gas within a flow pathway. Such components can be an upstream component connected to the upstream flow passage, and/or a downstream component connected to the downstream flow passage. The pre-processing module can include an upstream flow controller 440, such as to control the flow exiting from the source 404; an upstream pressure controller 460; an optional upstream concentration meter 430, such as to measure the concentration of the acetylene and stabilizer exiting from the source 404; an optional downstream concentration meter 432, such as to measure the concentration of the gas mixture or vaporized liquid component exiting from the bubbler 410; an optional downstream pressure controller 462, such as to control the pressure exiting from the bubbler 410; and/or an optional downstream flow controller 442, such as to control the flow exiting from the bubbler 410. In some embodiments, the pre-processing module can include an upstream flow controller 440 (as in FIG. 4B) or a downstream flow controller 442 (as in FIG. 4C). In other embodiments, the pre-processing module can include two flow controllers, including a first flow controller 440 in the upstream flow passage and a second flow controller 442 in the downstream flow passage (as in FIG. 4F).

Figure 4B:
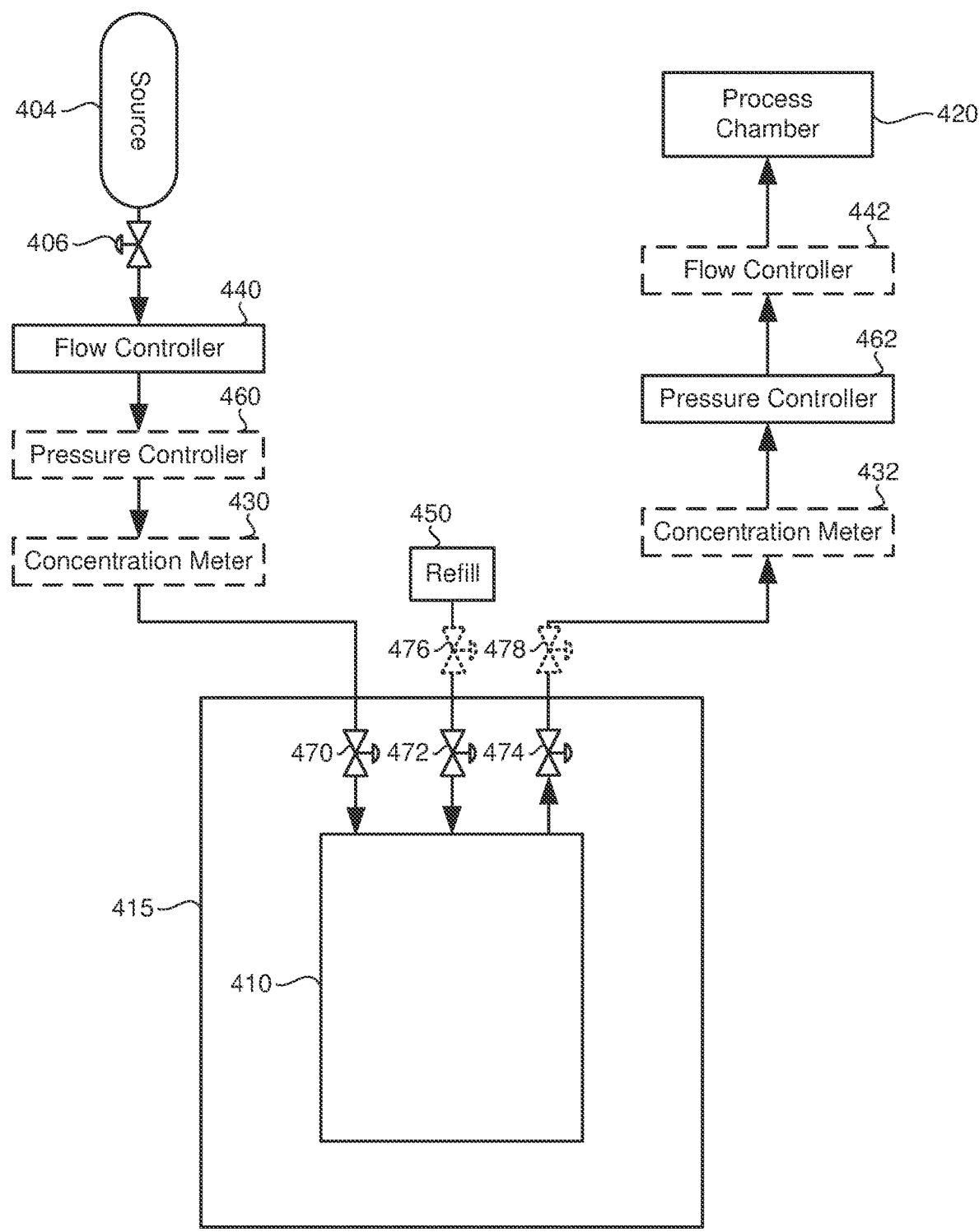

As seen in FIG. 4A-4B, the pressure controller can also be fluidically coupled downstream and/or upstream of the bubbler. In particular, the pre-processing module can include an upstream pressure controller 460 (as in FIG. 4A) or a downstream pressure controller 462 (as in FIG. 4B). In yet other embodiments, the pre-processing module can include two pressure controllers, including a first pressure controller in the upstream flow passage and a second pressure controller in the downstream flow passage (e.g., such as an upstream pressure controller 460 and a downstream pressure controller 462, which can both be present and arranged as in FIG. 4E). The location of the pressure controller can be chosen based on normal supply and process conditions, as well as the properties/abilities of the control system. Typically, a pressure controller is not provided in the bubbler.

Also regarding pressure control, a downstream concentration meter may be employed to determine if the bubbler or other system component is causing the gas mixture (e.g., the acetylene stream) to be out of specification. If the concentration meter and associated controller indicate that the acetylene concentration is out of specification, then the controller may adjust the pressure in the bubbler to compensate. In one non-limiting instance, if a 100 Torr pressure change causes a 1% change in stabilizer concentration, then the pressure in the bubbler may be adjusted according to that pressure-concentration relationship to provide the desired stabilizer concentration (e.g., a change in 100 Torr to provide a 1% change in stabilizer concentration, a change in 120 Torr to provide a 1.2% change in stabilizer concentration, etc.).

Figure 4C:
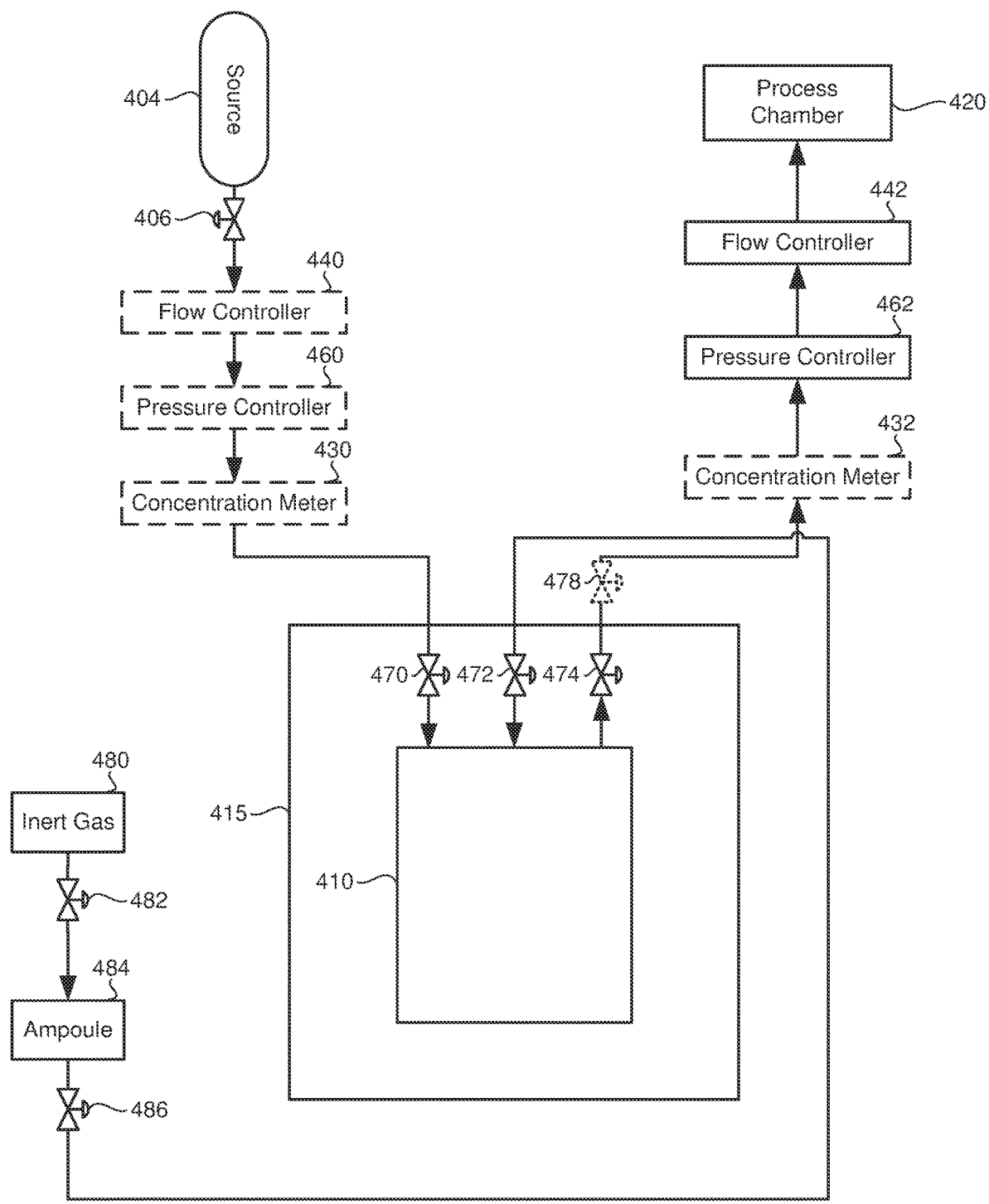

Yet other components can be located in the upstream flow passage and/or the downstream flow passage. Feedback loops, based on sensor measurement, may be used to alter operation conditions, such as flow rate, temperature, and/or pressure. In addition, combinations of components can be present. As seen in FIG. 4A, the pre-processing module can include a flow controller 440 present and a pressure controller 460 present in the upstream flow passage. In FIG. 4B, the pre-processing module can include a flow controller 440 present in the upstream flow passage and a pressure controller 460 present in the downstream flow passage. In FIG. 4C, the pre-processing module can include a flow controller 442 and a pressure controller 460 present in the downstream flow passage.

As also seen in FIG. 4C, the pre-processing module can be configured to be fluidically coupled to an inert gas source 480 and to an ampoule 484, each of which can be in proximity to a pressure regulator 482, 486. The ampoule 484 can contain a liquid for refilling the bubbler 410, and the processing line between the valves 486, 472 can be used to remove vaporized liquid from the bubbler.

Figure 4D:
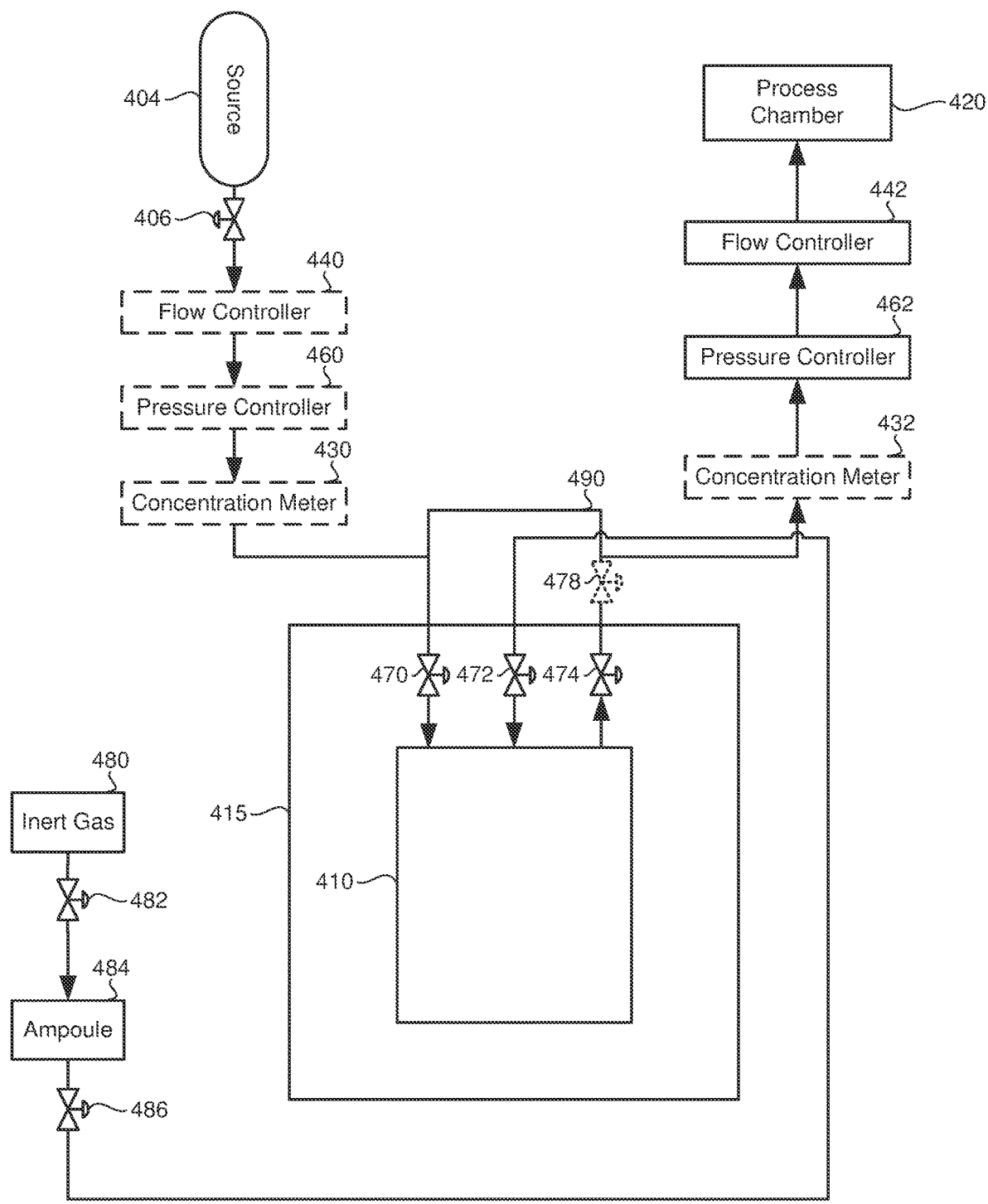

Other flow passages in the pre-processing module may accommodate different operations that can be useful during semiconductor processing. For instance, as seen in FIG. 4D, the pre-processing module can include a bypass pathway 490, which connects the upstream and downstream flow passages. In use, a gas component from the source 404 is provided directly to the process chamber 420 without being passed through the bubbler 410. Alternatively, a combination of a gas from the source 404 and a gas mixture from the bubbler 410 can be transported to the process chamber 420 if both of the bypass pathway 490 and a pathway exiting the bubbler 410 (e.g., a processing line by way of valve 474) are open.

Figure 4E:
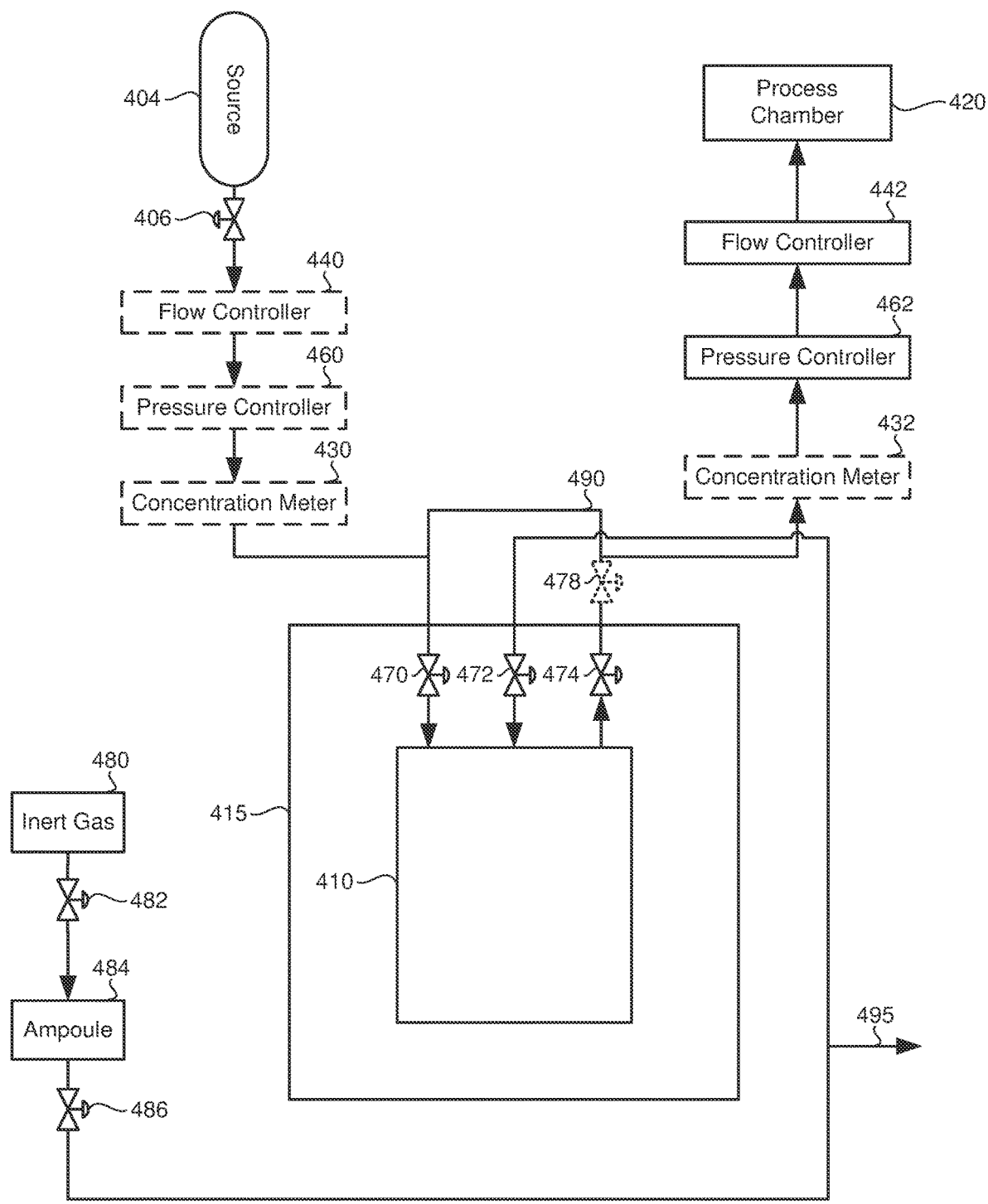

As seen in FIG. 4E, the pre-processing module can be configured to be fluidically coupled to an exit pathway 495, in which excess liquid can be removed from the bubbler 410 and directed to the exit pathway 495. In use, the exit pathway can be fluidically coupled to a vacuum to remove condensed liquid from the pre-processing module. Optionally, valve 486 may be closed to isolate the ampoule while removing excess liquid from the bubbler.

Figure 4F:
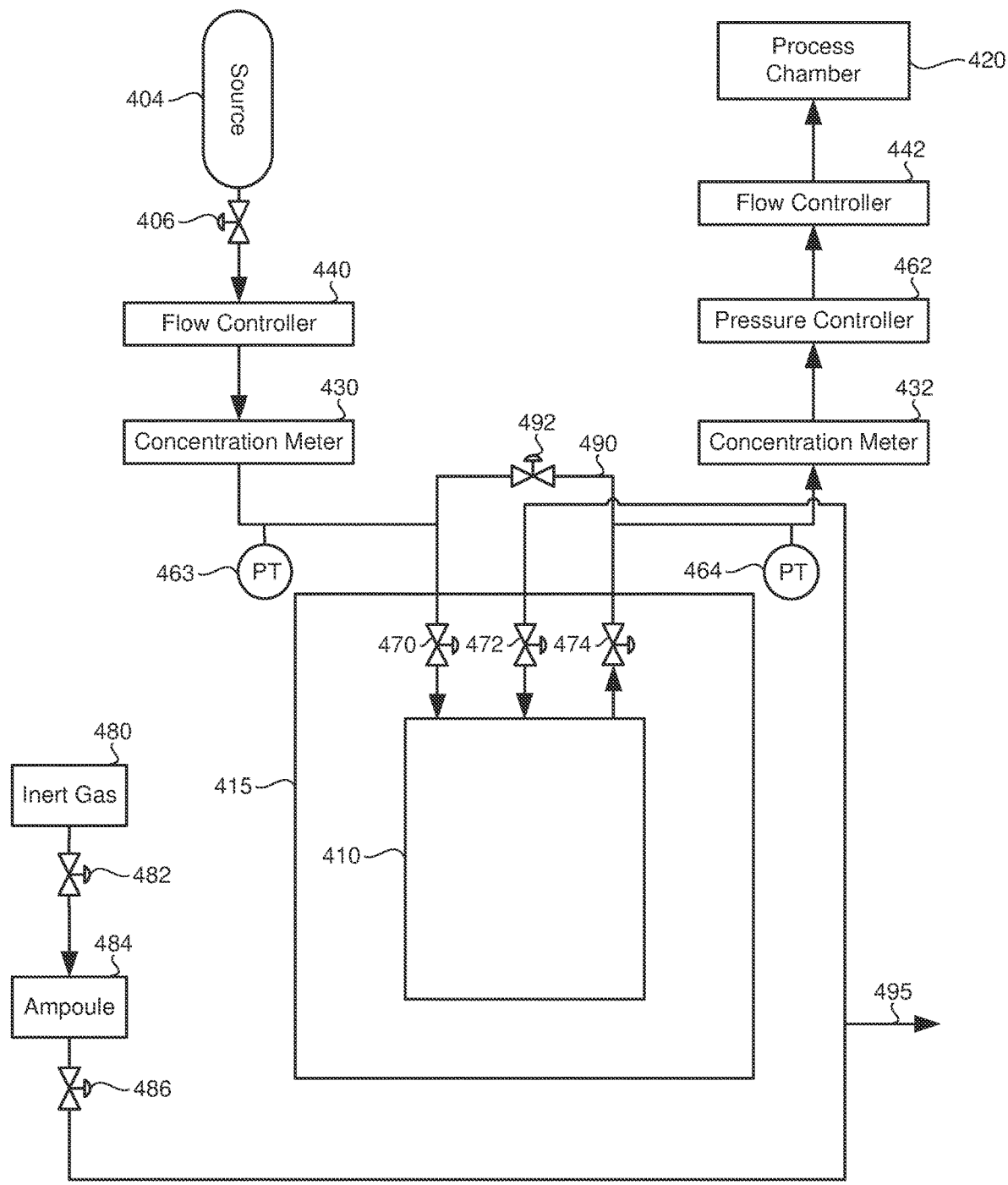

Further sensors may be included, as in the illustrative pre-processing module of FIG. 4F. As can be seen, the pre-processing module can include one or more pressure sensors (or pressure transducers, PT) 463, 464, as well as concentration meters 430, 432 in both of the upstream and downstream flow passages. A pressure regulator 492 can be present in the bypass pathway 490. The pre-processing module can include both an upstream flow controller 440 and a downstream flow controller 442, as well as a downstream pressure controller 462.

In certain embodiments, the concentration of stabilizer in the gas is controlled not by passing the gas through the bubbler but by introducing a stabilizer-rich gas or liquid to the flowing gas before it enters the reactor. An example of a pre-processing module implementing this approach is provided in FIG. 6, in the which the module can be configured to be fluidically coupled to a source 604 with a corresponding pressure regulator 606 and to a process chamber. The module itself can include a first flow controller 640 configured to be fluidically coupled to the source 604, a bubbler 610, and a second flow controller 645 fluidically coupled to the bubbler 610. In this embodiment, the source gas does not pass through the bubbler. Rather, the bubbler and associated control system are configured to provide additional stabilizer to the source gas when it is determined that the stabilizer concentration in the source gas is too low.

The temperature controller 615 can be used to control the temperature of the bubbler 610. One or more pressure regulators 609, 614, 652 can be employed to control the gas streams going into and out of the bubbler. In addition, a refill source 650 can be fluidically connected to the bubbler 610 to deliver a push gas via a refill line 654, 656. The output of the refill line 654 can be inserted into the headspace 611, or the output of the refill line 656 can be inserted into the liquid 612 within the bubbler 610.

The pre-processing module also includes a concentration meter 630 connected to a processing line 608 in the upstream flow passage, such as to measure the concentration of the gas component exiting from the source 604. This concentration meter 630 can also be connected, e.g., by way of a controller, to a pressure regulator 652 for the refill source 650.

Figure 6:
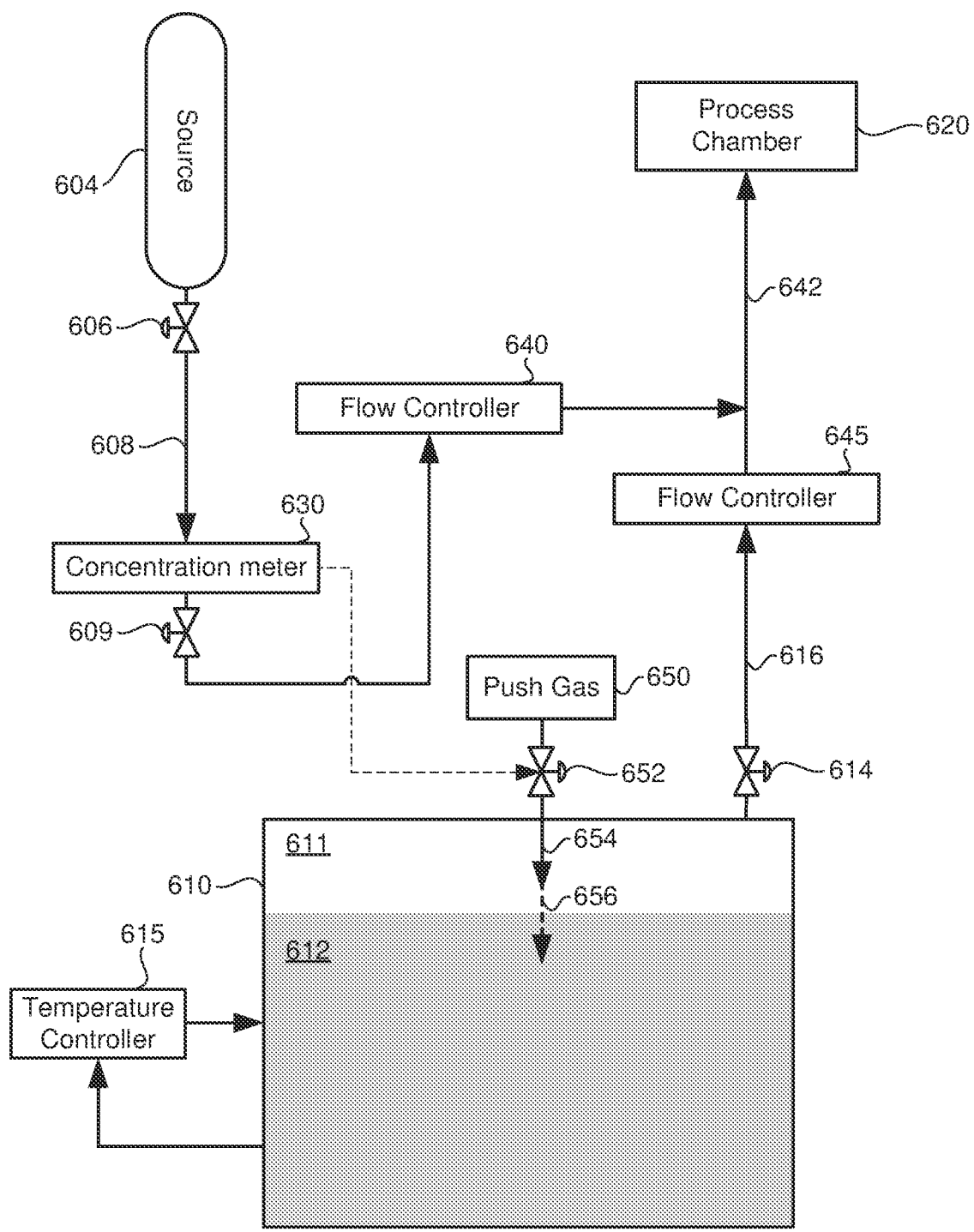
FIG. 6 shows an illustrative diagram of another non-limiting configuration for components within the pre-processing module. The pre-processing module provides a gas mixture that is a combination of a flowing gas stream from the source 604 and a stabilizer-rich gas from a headspace 611. This gas mixture can be transported via a processing line 642 that is fluidically coupled to a process chamber 620.

Flow controllers can be used to direct flow either around or through the bubbler. As seen in FIG. 6, a first flow controller 640 is connected to the upstream flow passage, such as to control the flow exiting from the source 604 and to direct this flow into a processing line 642 fluidically coupled to the process chamber 620. A second flow controller 645 is connected to the upstream flow passage to control flow exiting from a headspace 611 of the bubbler 610 via pressure regulator 614 and into a further processing line 616. Flow exiting the second flow controller 645 is directed via the processing line 642 into the process chamber 620.

Bubblers

The pre-processing module herein can employ a bubbler to provide a liquid under an atmosphere having a controlled temperature and pressure. In particular embodiments, the bubbler includes a chamber for holding a liquid, an inlet for receiving a gas (e.g., a gas component or a gas mixture) from a source, and an outlet for transporting a gas (e.g., a gas mixture including a vaporized liquid component) into a reactor or module.

The chamber for holding the liquid can have any useful configuration. Examples of such configurations can include one or more trays (e.g., a plurality of stacked trays), cylinders, chambers (e.g., dual chambers), tubes, plates, channels, baffles, or discs, which can be optionally disposed within an enclosure. Such configurations can have any useful arrangement, such as stacks, circuitous routes, parallel routes, layers, rings, etc. Within the chamber, the liquid can be stored under flow or no flow conditions. An example of a bubbler is provided in U.S. Pat. Nos. 9,334,566 and 4,140,735, as well as U.S. Pat. Pub. Nos. 2014/0029374 and 2014/0026977, each of which is incorporated herein by reference in its entirety.

The bubbler can include one or more heating or cooling elements to transfer thermal energy to or from the liquid within the chamber. In one embodiment, the element is a heat exchanger, an electric heater, a chiller, or a combination thereof. The element can be connected to a component of the bubbler, in which thermal energy transfers to or from the liquid in a direct or indirect manner. In particular embodiments, the chamber includes a plurality of trays configured to hold a liquid, and the element is dedicated to transfer thermal energy to the plurality of trays and the liquid.

One or more conduits or openings can be present to direct the gas component through the liquid within the chamber. In this way, the gas component mixes with the liquid to provide a gas mixture having the vaporized liquid component. In one instance, a conduit can include an opening, in which the conduit is configured to carry the gas component and in which the opening is located beneath a fill line of the liquid in the chamber. The conduit and the opening(s) can be configured to produce a flow of gas component in any useful manner (e.g., as gas bubbles having any useful diameter or diameter range at any useful rate). In particular embodiments, the bubbler is configured to provide a high flow rate of the gas mixture. In non-limiting embodiments, the bubbler is configured to provide a flow rate between about 1 slm to about 20 slm.

The bubbler can include one or more liquid level sensors configured to sense a level of the liquid in the chamber. Such sensors can be a discrete level sensor, a continuous level sensor, or any other described herein. In addition, the sensor can provide feedback to a controller. Based on the sensed level of the liquid in the bubbler, a controller may be used to control a valve to supply additional liquid to the chamber. In addition, the controller may be connected to one or more level sensors to sense a level of liquid in the storage tank or ampoule.

In one embodiment, the bubbler is fluidically coupled to a level sensor, which is configured to detect the liquid level within the chamber or to detect whether the liquid level is below the fill line for the chamber. Furthermore, the level sensor is configured to be connected to a controller, which in turn is connected to a valve for a connection between the chamber of the bubbler and a storage tank for the liquid. Upon sensing a liquid level that is too low or below the fill line, the controller can control a valve to the connection in order to refill the chamber with additional liquid. Conversely, if the liquid level is too high or above the fill line, then the controller can control an outlet to the connection to remove excess liquid from the apparatus. The outlet can optionally include a diverter valve to divert flow from the path to another chamber or a vacuum pump.

Liquid level control within the bubbler can be controlled by using a fill on demand strategy. In one instance, fill on demand may keep the level of liquid within the chamber at a relatively constant level, and the level may be calculated to result in an optimum headspace volume. Fill on demand may also maintain the liquid at a controlled, near constant temperature. In one no-limiting instance, a liquid level is maintained within the chamber by (a) determining that a liquid fill start condition is met; (b) filling a chamber with the liquid; (c) determining that a liquid fill stop condition is met; and (d) ceasing the filling of the chamber with the liquid. A liquid fill start condition can include determining that the liquid volume is below a threshold volume (e.g., less than about 50% of the total chamber volume). A liquid fill stop condition can include determining that a liquid full sensor has been triggered (e.g., when liquid volume exceeds more than about 70% of the total chamber volume), determining that a liquid fill timer has expired (e.g., a timer having a period less than about 45 seconds), or determining that a liquid fill stop has been triggered. The liquid level or volume can be determined by use of a sensor (e.g., a level sensor). Additional methods, apparatuses, and system for fill on demand are described in U.S. Pat. Pub. Nos. 2016/0052651 and 2016/0052655, each of which is incorporated herein by reference in its entirety. Additional details are provided in FIG. 3B-3E, which are described below.

Figure 3B:
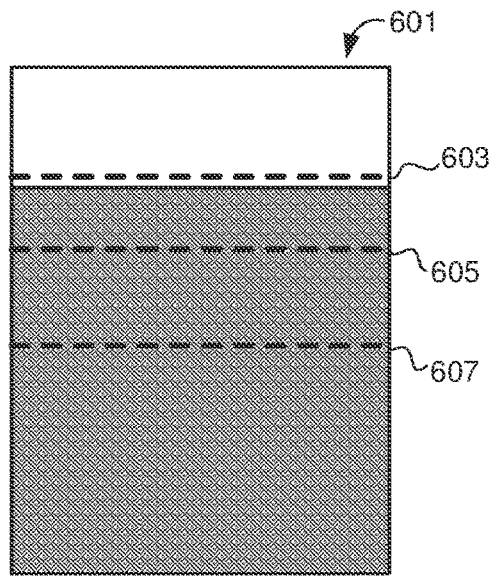

FIG. 3B depicts an embodiment in which a bubbler 601 has one or more sensors configured to sense three sensor levels: a full sensor level 603, a low sensor level 605, and an empty sensor level 607. Various types of physical sensors may be employed to determine the internal fill level. Examples include single point and multipoint liquid level sensors such as those available from Neal Systems, Inc. In some cases, a single physical sensor can measure two or more levels. In one example, a multipoint sensor is configured to measure three levels, the full level, the low level, and the empty level.

In certain embodiments, the full sensor level is for a predetermined liquid level (e.g., at a bubbler volume of between about 20% and 70% or about 30% to 50% of the total fill volume of the chamber in a bubbler, thereby maintaining a certain useful headspace within the bubbler chamber). In certain embodiments, the low sensor level is at a level of between about 10% and 20% of the total fill volume of the chamber. In certain embodiments, the empty sensor level is set at about 5% to 10% of the total fill volume of the chamber. In one example, the full level sensor is marked at about 30% to 50% of the total chamber volume, the low level sensor or is set at about 20% of the chamber volume, and the empty level sensor is set at about 10% of the total chamber volume, which may be about 330 cubic inches. As further examples, the chamber volume may be between about 100 and 1000 cubic inches, depending on the process chamber size and the process(es) supported. Refilling of the chamber can be initiated when a liquid level in the chamber does not meet the full sensor level. In this way, if the liquid is indicated to be below the full sensor level (e.g., when the liquid full sensor turns off), then refill will occur until that full sensor level is met. Such refilling can occur in small increments. In other embodiments, refilling of larger increments can be initiated when the liquid level in the chamber approaches the low sensor level (e.g., when the liquid low sensor turns on).

Figure 3C:
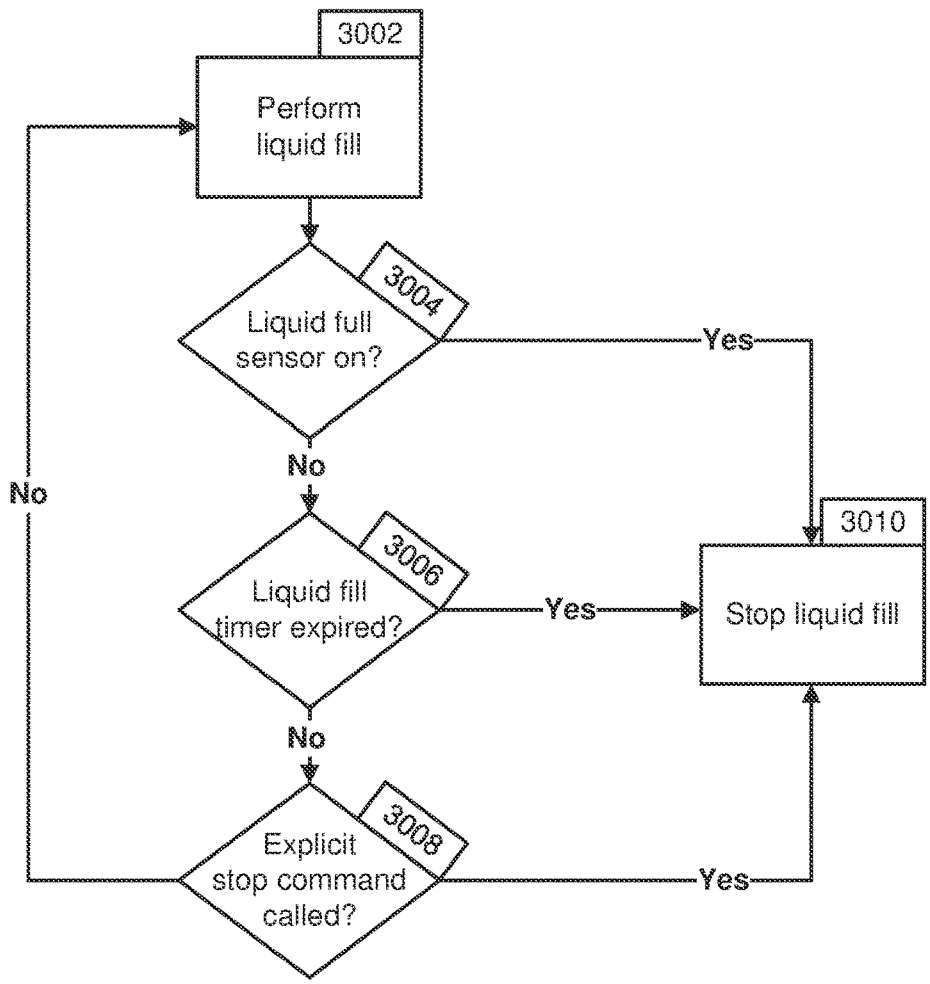

The chamber may cease being filled due to a variety of different conditions. Such conditions are described in greater detail in FIG. 3C. In certain implementations, the chamber may initially be at a full level. In such implementations, the initial filling of the chamber may be skipped. FIG. 3C is a process flow diagram detailing an algorithm to control a fill on demand chamber of the bubbler. In operation 3002, a command is given to perform a liquid fill, which may be given through logic contained in a controller. The controller may be a controller used to control other processing operations of a substrate, or it may be a separate controller dedicated to controlling operations associated with the bubbler. Once the command is given to perform the fill, liquid begins to fill the bubbler chamber. While the fill is performed, the controller may also concurrently perform operations 3004, 3006, and 3008.

In operation 3004, the controller checks to see if the liquid full sensor is on. The chamber in the bubbler may contain a level sensor, such as a discrete level sensor. The level sensor may be set to detect a certain liquid level within the chamber, such as the full level. Such a liquid full level may be calculated to result in a bubbler that contains an optimum headspace volume. In certain implementations, the full level may be a threshold volume calculated to arrive at the optimum headspace volume. Such threshold volumes may be, for example, a volume of liquid of around about 20% to 70% of the total volume of the chamber, such as about 30% to 50% of the total volume of the chamber. In other implementations, the threshold volume may be a particular volume (e.g., about 40%). In such implementations, a liquid volume falling within the particular volume or volume ranges may satisfy the full condition. In certain such implementations, subsequent secondary chamber fillings may be adjusted based on the detected liquid volume. For example, the stop conditions of the subsequent secondary chamber fillings may be adjusted. In certain other implementations, the level sensor may report a low level. The low level may be reported when the volume of the liquid within the chamber is below a threshold percentage of the chamber volume. In such implementations, the threshold volume may be a volume of less than about 20% of the chamber volume.

In operation 3006, the controller checks to see if the liquid fill timer has expired. The chamber fill timer may be a timer set in the controller, such that the chamber fill process is performed for only a duration close to the duration that would be required to fill the chamber to the full level. In certain implementations, the fill timer may be a duration slightly longer than the time required to fill the chamber to the full level in order to introduce some safety factor. In other implementations, the chamber fill timer may be much longer than the duration required to fill the chamber to full. In such implementations, the fill timer duration may be selected to allow the best opportunity to fill the chamber to a full level, and the chamber full sensor may be relied upon as the primary mechanism to prevent overfilling of the chamber. In other embodiments, rather than a fill timer, the controller can check to see if the chamber full sensor is turned on to show sufficient filling of the chamber and, if the full sensor is on, to stop the liquid fill.

In certain implementations, the fill timer for the initial fill and the secondary fill may be different. In such implementations, the initial fill timer may be, for example, 45 seconds or less, while the secondary fill timer may be, for example, between 5 to 10 seconds. In other implementations, the fill timer may be adjusted based on a correction factor. The correction factor may be a factor to account for the differences in pressures of the refill lines of various different processing conditions.

In certain implementations, the secondary fill timer may stay constant regardless of the conditions detected during the initial fill. In other implementations, the secondary fill timer may be adjusted depending on conditions detected during the initial fill. For example, if, during initial fill, the chamber full sensor was never detected to be on, the duration of the secondary fill timer may be lengthened to allow for a greater likelihood of the chamber reaching a full level during the secondary fill operation.

In operation 3008, the controller checks to see if an explicit stop command has been called. In certain implementations, an explicit stop command to cease filling the chamber may be programmed into the controller before the performance of certain processing steps, such as deposition steps where concurrent filling of the chamber during performance of the steps may result in unacceptable agitation of the liquid. The explicit stop command may be a further safeguard against the failure of the chamber full sensor and/or the chamber fill timer. Additionally, the fill timer and/or the full volume may be user defined parameters in certain implementations. The explicit stop command may prevent errors in the user definition of the parameters from affecting the quality of substrate processing.

If the controller detects a "yes" result from any of operations 3004, 3006, or 3008, the controller then proceeds to operation 3010 and the liquid fill is stopped. If a "yes" result is absent from any of operations 3004, 3006, or 3008, then the controller may return to operation 3002 and continue performing the liquid fill.

Figure 3D:
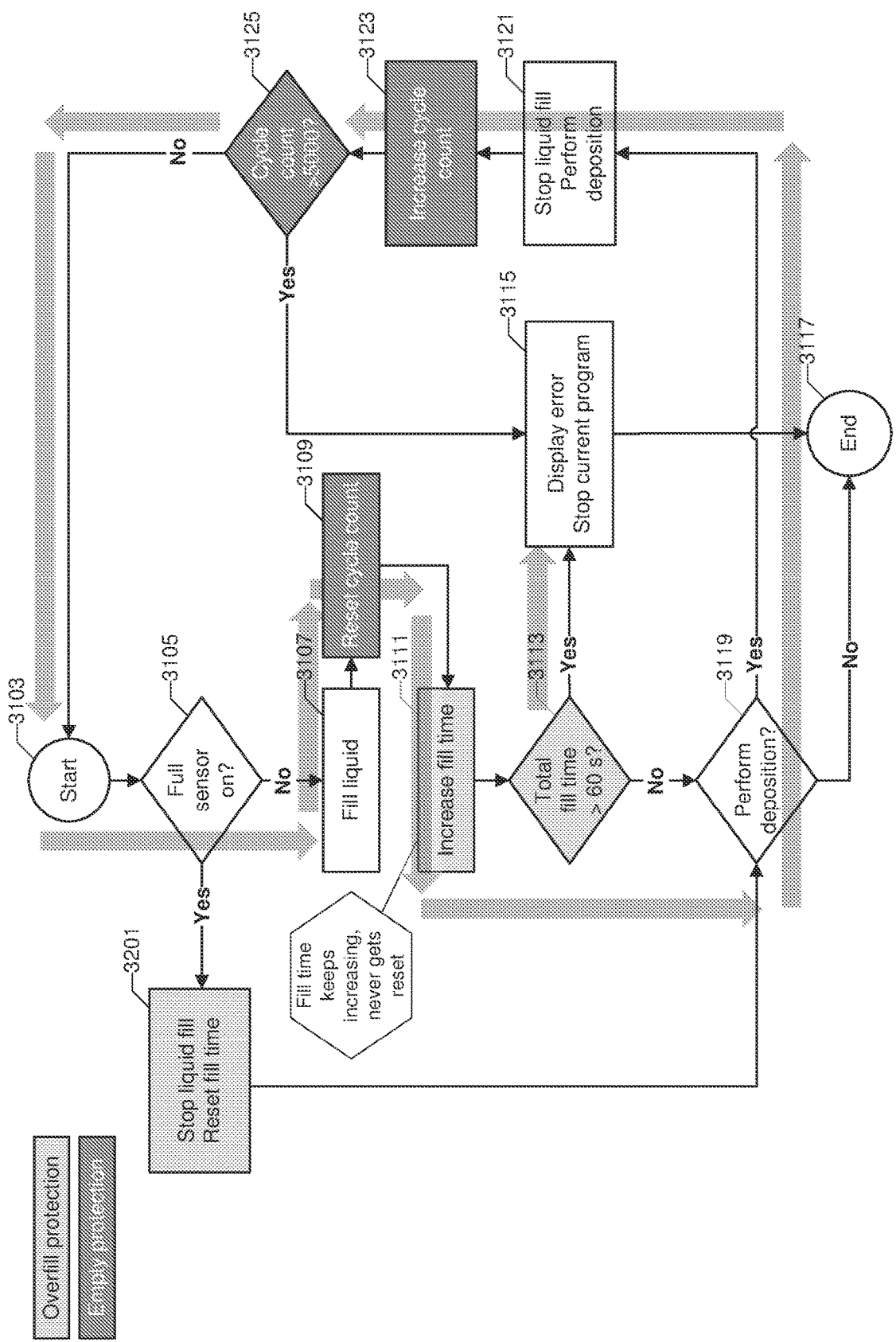
Figure 3E:
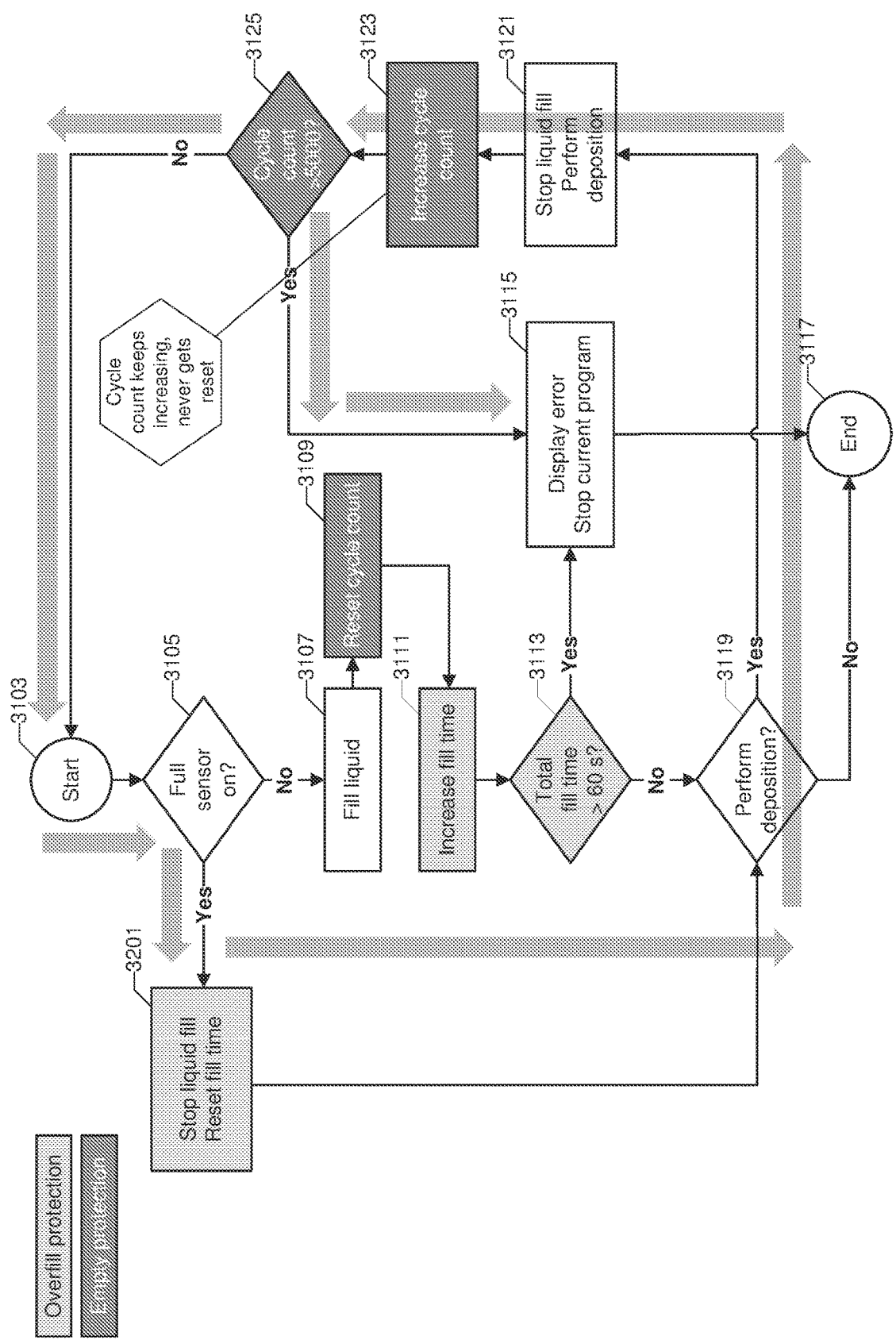

FIG. 3D-3E presents flow charts for overfill protection and empty protection modes, respectively. The blocks shown in the flow chart represent execution steps in a program or other logic for implementing liquid fill control in a pre-processing module.

In the depicted embodiment of FIG. 3D, the bubbler control logic is represented as a loop that begins at the start operation 3103. During execution, with each iteration, no particular operation occurs at block 3103. In each iteration, the process logic determines, at a decision block 3105, whether the full sensor is in the on state. If so, the overfill protection portion of the routine is not executed, and the process proceeds is as described with respect to FIG. 3E.

In the overfill protection portion of the routine, the full sensor is not on, and, as depicted in FIG. 3D, the logic provides instructions to fill the chamber with liquid, as depicted in a block 3107. Concurrently, the process resets a cycle count, which may be used in the empty protection mode as described further with respect to FIG. 3E (see block 3109). As the fill proceeds, a fill timer keeps track of the accumulated fill time since last time the fill timer was reset (see block 3111). Next, the bubbler fill logic determines whether the total accumulated fill time is greater than a threshold value, such as 60 seconds (see decision block 3113). If so, the logic puts the system into an error state and stops executing, as depicted in block 3115. The system may then enter a soft shutdown, and the process ends as depicted at block 3117. If the accumulated time tallied by the fill timer has not exceeded the threshold, then the control logic proceeds from block 3113 to a subsequent decision block 3119, where it determines whether the system is to perform a semiconductor process (e.g., deposition). If not, the routine gracefully ends at block 3117. However, if the logic determines that deposition is to proceed, the process stops the liquid fill and concurrently pauses the timer as illustrated in a block 3121.

In the embodiment depicted in FIG. 3D, the full sensor remains in an off state so that bubbler refill occurs whenever possible, consistent with the underlying fill on demand logic, and thereby remains in danger of overfilling the bubbler chamber. Returning to block 3121 in the process flow logic, the system begins performing a semiconductor process and then increments a cycle counter as illustrated in blocks 3123 and 3125, which will be described in further detail with reference to FIG. 3E. The process control then returns to block 3103, where the full sensor is again checked.

As explained, the logic depicted in FIG. 3D illustrates the operation of an overfill protection mode and assumes that the full sensor remains on at all times. In this state, the fill timer keeps increasing and never gets reset as illustrated at block 3111. Therefore, even if the fill timer is paused repeatedly while filling stops during the above-described fill on demand algorithm, the accumulated fill time gets closer and closer to the threshold and will eventually trigger entry into an error state as illustrated at block 3113 and 3115.

FIG. 3E presents the flow chart of FIG. 3D but depicts an empty protection mode built on top of the fill on demand logic. As before, the iterative process determines whether the full sensor is on as illustrated at a decision block 3105. In this example, it is assumed that the full sensor is malfunctioning by reading that it is on when in fact it should be off. As illustrated, when the logic determines at block 3105 the full sensor is on, the bubbler fill logic will stop any current liquid fill (see block 3201). Concurrently, the logic resets the fill timer, which is relevant to the overfill protection routine described with respect to FIG. 3D. After stopping liquid fill at block 3201, the process next determines whether it is time to perform a semiconductor process (e.g., deposition, as illustrated at decision block 3119). Assuming that semiconductor process is to be performed, the process logic instructs the system to perform the process, as illustrated at block 3121.

As the semiconductor process proceeds, each cycle is counted, or at least those cycles in which liquid is consumed (see block 3123). As cycle count increments over one or more sequential deposition cycles that may pause periodically for wafer indexing and the like, a cycle counter compares the current cycle count against some threshold number of cycles, as illustrated at decision block 3125. As explained, the cycle count is determined to protect the bubbler from becoming dangerously under filled. When the cycle count ultimately exceeds the threshold—presumably because the full sensor is faulty or malfunctioning—the process control is directed to block 3115 where it puts the system in an error state and ends the routine's execution, typically accompanied by a soft shutdown. Until the time when the cycle count exceeds the threshold, the process repeatedly loops back to block 3103 and 3105, where the full sensor is again checked. Assuming, as is the case here, that the full sensor remains on, the process proceeds through the branch including block 3201, where the semiconductor process continues to occur with no renewed bubbler filling.

In addition to filling the bubbler with liquid, excess liquid can be removed. Addition can include use of a connection between the chamber and a source of the liquid (e.g., an ampoule or a storage tank). The connection can optionally include a nozzle, in which the nozzle can be located above a fill line (e.g., to deliver liquid into the headspace), at the fill line, or below the fill line (e.g., to deliver additional liquid into the bulk liquid phase). Removal can include use of an outlet that is fluidically coupled to the connection and an output (e.g., the source or other container or chamber under vacuum).

Operating conditions can be adjusted and monitored in proximity to the bubbler. For instance, the bubbler can be fluidically coupled to one or more other components, such as a flow controller, pressure controller, pressure transducer, level sensor, temperature sensor, etc., including any other described herein. In one embodiment, the bubbler is fluidically coupled to a flow controller configured to control flow of the gas mixture leaving the bubbler.

Delivery of a gas component, a liquid, a vaporized liquid component, and the resultant gas mixture can include use of controlled flow by way of controlling valves fluidically coupled to connections (or processing lines). The timing of opening and closing such valves can be implemented by a controller. Such controlled valves can be used to direct flow of the gas component and liquid to the bubbler, as well as to direct flow of the gas mixture from the bubbler.

In one instance, a valve of the bubbler is opened before a process step (e.g., a dose step) to flow a gas mixture from the bubbler to a process chamber; and then the bubbler valve can be closed to stop flow of the gas mixture. Then, a valve of the process chamber can be opened to allow flow of the gas mixture to enter the process chamber. Optionally, the bubbler valve is opened before a process step by an amount of time that is substantially equal to a line charge time, which is the time required for a gas mixture to flow from the bubbler to the process chamber. Additional methods and apparatuses for controlling flow are described in U.S. Pat. No. 10,094,018, which is incorporated herein by reference in its entirety.

Other Components for Pre-Processing Module and Apparatuses

The pre-processing module can include one or more components (e.g., as described herein). For instance, one or more flow controllers, valves, pressure controllers, and/or temperature controllers can be present to control operating conditions. Furthermore, one or more sensors (e.g., level sensors, concentration sensors, pressure sensors, and/or optical sensors) can be present to provide sensing measurements to a controller to adjust the components.

One or more pressure controllers can be used to provide a particular constant total pressure within the apparatus. In particular instances, a back pressure controller is employed, in which a variable orifice is placed downstream of a pressure sensor and the opening size is selected to provide a particular upstream pressure. Examples of pressure controllers include a variable orifice or a variable restricted orifice, which can be operated in closed loop or open loop fashion.

One or more flow controllers can be used to control flow of the gas component, vaporized liquid component, or gas mixture. Such flow controllers can be used to control flow within the upstream and/or downstream flow passages. Examples of flow controllers includes a mass flow controller (MFC), a mass flow meter (MFM), or a liquid flow controller (LFC). In some instances, MFCs may be used because of their ability to produce a steady, consistent gas flowrate, which causes a more stable, consistent gas flow that reduces pressure fluctuations and also enables the gas flowrates to be known without separately measuring the gas flow. In other instances, an MFC can be operated in a wide open state, thus operating as an MFM. In non-limiting embodiments, the flow controller is configured to provide a flow rate between about 1 slm to about 20 slm.

One or more valves can be used to stop, continue, or divert flow within a flow pathway. Such valves can be connected to a controller, which can adjust the valve in response to a signal from a sensor. Examples of valves include diaphragm valves.

One or more level sensors can be used to detect or measure a liquid level within the chamber of the bubbler and/or within a storage tank of the liquid. Such sensors can be monitored by way of a controller, in which signal from the level sensor to a controller can result in modulation of a valve to adjust the liquid level within the chamber. Examples of level sensors include a discrete level sensor, a continuous level sensor, an acoustic echo type sensor, a capacitive strip sensor, and a high sensitivity pressure transducer sensor. In some embodiments, a radar sensor, suitable for hazardous environment, using either wavelength in Infrared Red or Radio Frequency regions may be used. In one specific embodiment, a sensor operating at 6.3 GHz is used to track the level of the fluid. The level sensor then sends a signal to a programmable logic controller (PLC).

One or more concentration sensors can be used to detect a concentration within a flow pathway. Such concentration sensors can be used to detect concentration (e.g., of the vaporized liquid component) in the upstream and/or downstream flow passages. Examples of concentration sensors include a concentration meter, an acoustic piezoelectric oscillator sensor, an infrared concentration, an optical vapor concentration sensor, or a photoionization concentration sensor.

One or more pressure sensors can be used to detect pressure within a flow pathway. Examples of pressure sensors include a pressure transducer, a pressure manometer, etc.

A temperature controller can be employed to control the temperature of the bubbler or a chamber or tank holding the liquid to be vaporized. The temperature controller can be a heater, a heat exchanger, a chiller, a direct contact thermoelectric chiller, a thermoelectric bath, a Peltier device, etc. In particular embodiments, the temperature controller maintains a temperature of from about −20° C. to about 20° C. of the stabilizer or the liquid to be vaporized. Yet other temperature ranges include from about −10° C. to about 10° C. or about −10° C. to about 5° C. of the stabilizer or the liquid to be vaporized.

Yet other components can include one or more filters to remove particulates or debris from gas within a flow pathway, as well as one or more temperature sensors can be used to detect temperature within a flow pathway. Examples of temperature sensors include a thermocouple.

One or more controllers can be present to control the pre-processing, including the components thereof. For instance, signals for monitoring the processes, the apparatus, and the system may be provided by analog and/or digital input connections of a controller from various sensors. The signals for controlling the processes may be output on the analog and/or digital output connections of the apparatus or system. Non-limiting examples of sensors that may be monitored include flow controllers (such as MFCs), pressure sensors (such as manometers), thermocouples, valve configurations, moisture and oxygen sensors, flow rates, gas supplies, etc. Appropriately programmed feedback and control algorithms may be used with data from these sensors to control the pre-processing module as described herein. In addition to controller(s) for the pre-processing module, one or more system controllers can be used to control components that could be used in concert with a pre-processing module (e.g., one or more sources, processing reactors, processing modules, and combinations thereof).

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for an apparatus, on or for a semiconductor wafer, or to a system. The operational parameters may, in some embodiments, be part of a recipe defined by process engineers to accomplish one or more pre-processing steps (e.g., during the delivery of one or more gases, vaporized liquid components, or gas mixtures) or processing steps (e.g., during fabrication of one or more layers, materials, metals, oxides, silicon, silicon dioxide, surfaces, circuits, and/or dies of a wafer).

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of semiconductor processing. The computer may enable remote access to the system to monitor current progress of process or fabrication operations, examine a history of past process or fabrication operations, examine trends or performance metrics from a plurality of process or fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Gas Components

The apparatuses, systems, and methods herein can be employed with any useful gas component. As described herein, the gas component includes one or more gases to be introduced into the pre-processing module. After introducing one or more vaporized liquid components into the gas component, a gas mixture is formed.

Non-limiting, illustrative gases for a gas component includes acetylene, oxygen ($O_2$), hydrogen ($H_2$), nitrogen ($N_2$), helium, argon, a carrier gas, an inert gas, or any combination thereof. The gas component can further include vapor forms of any other compounds, such as stabilizers, precursors, or other compounds described herein.

The gas component can be provided from a source. Exemplary sources can include a pressurized tank including one or more gases and, optionally, one or more vaporized compounds (e.g., any described herein). Such a tank can be fluidically coupled to an apparatus in any useful manner, such as by way of a pressure regulator.

Vaporized Liquid Components

The vaporized liquid component is provided by passing a gas component through a liquid. The liquid can be provided in any useful manner, such as by way of a source, a storage tank, or an ampoule.

Examples of vaporized liquid components include vapor forms of one or more stabilizers (e.g., acetylene stabilizers, such as any described herein), one or more precursors, and any combination thereof. Non-limiting, illustrative vaporized liquid components include vapor forms of acetone, N,N-dimethyl formamide, a carbon-containing precursor, a silicon-containing precursor (e.g., a silane, a poly silane, a halosilane, an aminosilane, silicon tetrahalide, etc.), a borane (such as tetraethylborane), a borate (such as tetraethyl borate), a boron trihalide, a phosphorous oxyhalide, a phosphorous trihalide, arsenic trihalide, antimony pentahalide, and tungsten halides (e.g., tungsten hexachloride or tungsten pentachloride), in which halosilanes or halides can include one or more halogens, e.g., one or more F, Cl, and/or Br, and others.

Acetylene and Acetylene Stabilizers

The pre-processing modules, apparatuses, systems, and methods herein can be employed with a gas component that includes acetylene. In non-limiting embodiments, the vaporized liquid component can be an acetylene stabilizer.

Acetylene is known to be explosive when pressurized above 15 psig. To avoid explosions during storage and transportation, acetylene may be stored in a canister or cylinder filled with a porous material having a stabilizer. Acetone is commonly used for as a stabilizer in part because acetylene is highly soluble in acetone. One volume of liquid acetone can absorb twenty-five volumes of gaseous acetylene at temperatures of about 15° C. under atmospheric pressure and will continue to absorb an additional twenty-five volumes of acetylene for every additional atmosphere of pressure to which acetylene is subjected. In using acetylene as a precursor for the deposition of carbon films in chemical vapor deposition (CVD) processes, the cylinders are connected to a gas line. Acetylene is then fed into the line for introduction to the deposition chamber.

Illustrative, non-limiting acetylene stabilizers include a low-vapor pressure solvent in which acetylene dissolves. In certain embodiments, the stabilizer has a vapor pressure of less than about 150 Torr at 25° C., and more particularly lower than about 75 Torr, and in certain embodiments, lower than about 10 Torr. Examples of stabilizers include a ketone. In other embodiments, the stabilizer is acetone, N,N-dimethyl formamide, N-methyl-2-pyrrolidone, N-ethyl-2-pyrrolidone, α-butyrolactone, γ-butyrolactone, and mixtures or combinations thereof. Yet other examples of stabilizers are listed below with their vapor pressure (at 25° C. unless otherwise noted): acetone—250 Torr; N,N-dimethyl formamide (DMF)—3.7 Torr; butanol—6 Torr; ethanol—59 Torr; ethylene glycol—0.07 Torr; methanol—127 Torr; propanol—20 Torr; isopropyl alcohol (IPA)—43 Torr; benzene—101 Torr; toluene—28 Torr; o-xylene—7 Torr; m-xylene—8 Torr; p-xylene—9 Torr; chloroform—194 Torr; acetonitrile—88 Torr; acetic acid—16 Torr; ethyl acetate—95 Torr; methyl ethyl ketone (MEK)—90 Torr; and diethyl ketone (DEK)—28 Torr (at 20° C.).

Further stabilizers can include one or more of the following: ionic liquids (e.g., including a cationic moiety including imidazolium, pyridinium, pyrrolidinium, ammonium, phosphonium, thiazolium, and/or triazolium; and an anionic moiety including tetrafluoroborate, hexafluorophosphate, bistriflimide, triflate, acetate, trifluoroacetate, triflimide, halide, bis(trifluoromethylsulfonyl)imide, methylsulfate, ethyl sulfate, docusate, and/or dicyanamide), carbenes or carbene derivatives (e.g., transition metal carbene complexes, N-heterocyclic carbenes, and/or methylenes), silylenes (e.g., N-heterocyclic silylenes), onium compounds (e.g., a nitronium ion, a nitrosonium ion, a bis(triphenylphosphine) iminium ion, an iminium ion, a diazenium ion, a guanidinium ion, a nitrilium ion, a diazonium ion, a pyridinium ion, a pyrylium ion, and a thionitrosyl ion), ketones (e.g., a ketone having a vapor pressure of about 30 Torr or lower at 25° C.; including a cyclic ketone, an aryl ketone, a dione, or a trione), aldehydes (e.g., benzaldehyde), esters (e.g., an ester having a vapor pressure of about 90 Torr or lower at 25° C.; including a cyclic ester, a glycol based ester, a lactate, a carbonate ester, an amino ester, or a diester), anhydrides (e.g., an anhydride having a vapor pressure of about 200 Torr, 90 Torr, 15 Torr, or lower at 25° C.; including formic anhydride, maleic anhydride, succinic anhydride, and others), unsaturated linear or branched hydrocarbons, unsaturated ring hydrocarbons (e.g., having a vapor pressure of about 5 Torr or lower at 25° C.), non-aromatic unsaturated ring hydrocarbons (e.g., cyclopentene and/or cyclohexene), amides (e.g., an amide having a vapor pressure of about 3 Torr or lower at 25° C.; or an amide selected from a dialkyl amide, a pyrrolidone, an acetamide, a morpholide, an ester amide, and a cyclic amide), ethers (e.g., furan, tetrahydrofuran, and/or pyran), amines, guanidines, imines, nitriles (e.g., having a vapor pressure of about 80 Torr or lower at 25° C.), nitrogen-containing saturated heterocyclic ring compounds (e.g., pyrrolidine and/or morpholine), nitrogen-containing unsaturated heterocyclic ring compounds (e.g., pyridine, pyrizine, imidazole, pyrrole, N-iminopyridinium ylide, triazole, thiazole, and substituted derivatives thereof), mixed electron donor compounds comprising a pi bond and an atom having a lone electron pair (e.g., acetone, imine, 2-methyl-2-butenone, triazole, and/or thiazole), phosphorus-containing compounds in which the phosphorus atom has a lone electron pair (e.g., triphenylphosphine and/or triphenylphosphineoxide), organo-phosphorus compounds, sulfur-containing compounds in which the sulfur atom has a lone electron pair (e.g., thiophene, thiazolium, thiazole, benzothiophene, and substituted forms thereof), organosulfur compounds, and/or metal compounds (e.g., e.g., transition metal compounds and metal salts). Any of the acetylene stabilizers herein can be used alone or in combination with another stabilizer.

Methods Employing a Pre-Processing Module

Figure 5A:
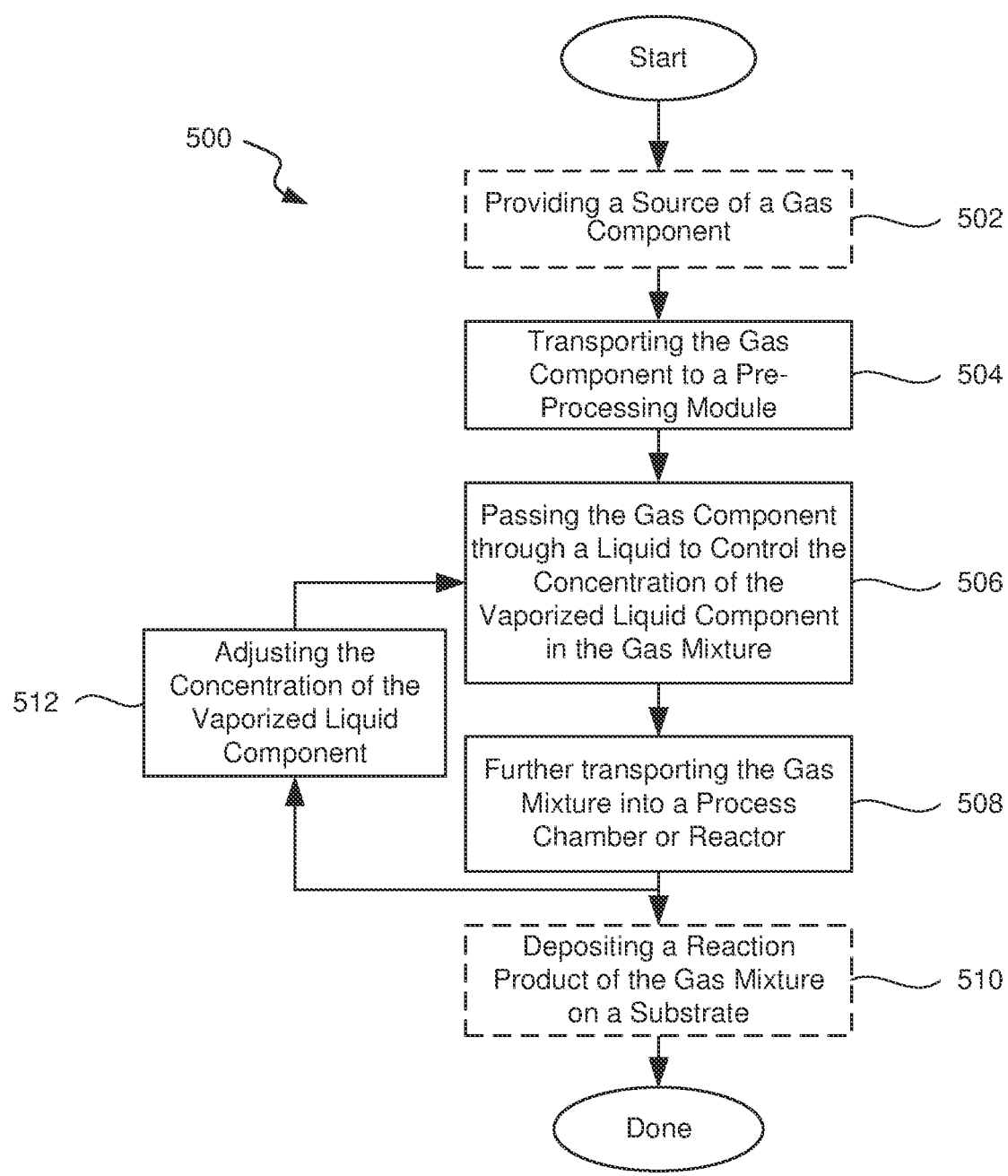
FIG. 5A-5B shows illustrative flow charts for process flows to provide a gas mixture including a vaporized liquid component. Provided are (A) a flow chart for a process 500, which includes optionally providing 502 a source of a gas component, transporting 504 the gas component to a pre-processing module, passing 506 the gas component through a liquid in the pre-processing module to control the concentration of a vaporized liquid component in a gas mixture, further transporting 508 the gas mixture into a process chamber or reactor, adjusting 512 the concentration of the vaporized liquid component, and optionally depositing 510 a reaction product of the gas mixture on a substrate; and (B) a flow chart for a process 520, in which the gas component is acetylene, the vaporized liquid is a vaporized stabilizer, and a high carbon content material is optionally deposited.

FIG. 5A is a flowchart illustrating some stages in a process flow 500 for treating a stream of a gas component in accordance with certain embodiments. The process optionally starts with providing 502 a source of a gas component. By way of example, the gas component can be an inert gas, a non-inert gas, or acetylene that may be supplied in cylinders (also referred to as bottles). The process 500 can include transporting 504 a gas component to a pre-processing module (e.g., any herein); passing 506 the gas component through a liquid to control a concentration of the vaporized liquid component in the gas mixture; further transporting 508 the gas mixture into a process chamber or reactor; and optionally depositing 510 a reaction product of the gas mixture on a substrate. If desired, the process can include adjusting 512 the concentration of the vaporized liquid component within the gas mixture.

Methods can include other operations, including determining a level of a liquid in the bubbler's chamber and either delivering additional liquid to the chamber or removing excess liquid from the chamber, if desired. Such a level can be determined by using a liquid level sensor fluidically coupled to the bubbler. Delivering and removing can be conducted by use of one or more controllers to open or close processing lines coupled to the bubbler. Yet other operations can include adjusting one or more experimental parameters, such as pressure, flow rate, and/or temperature, to obtain the desired substantially constant concentration value of the vaporized liquid component. Such adjustments can include use of a controller, as well as sensors to determine to what extent such parameters have been adjusted.

Figure 5B:
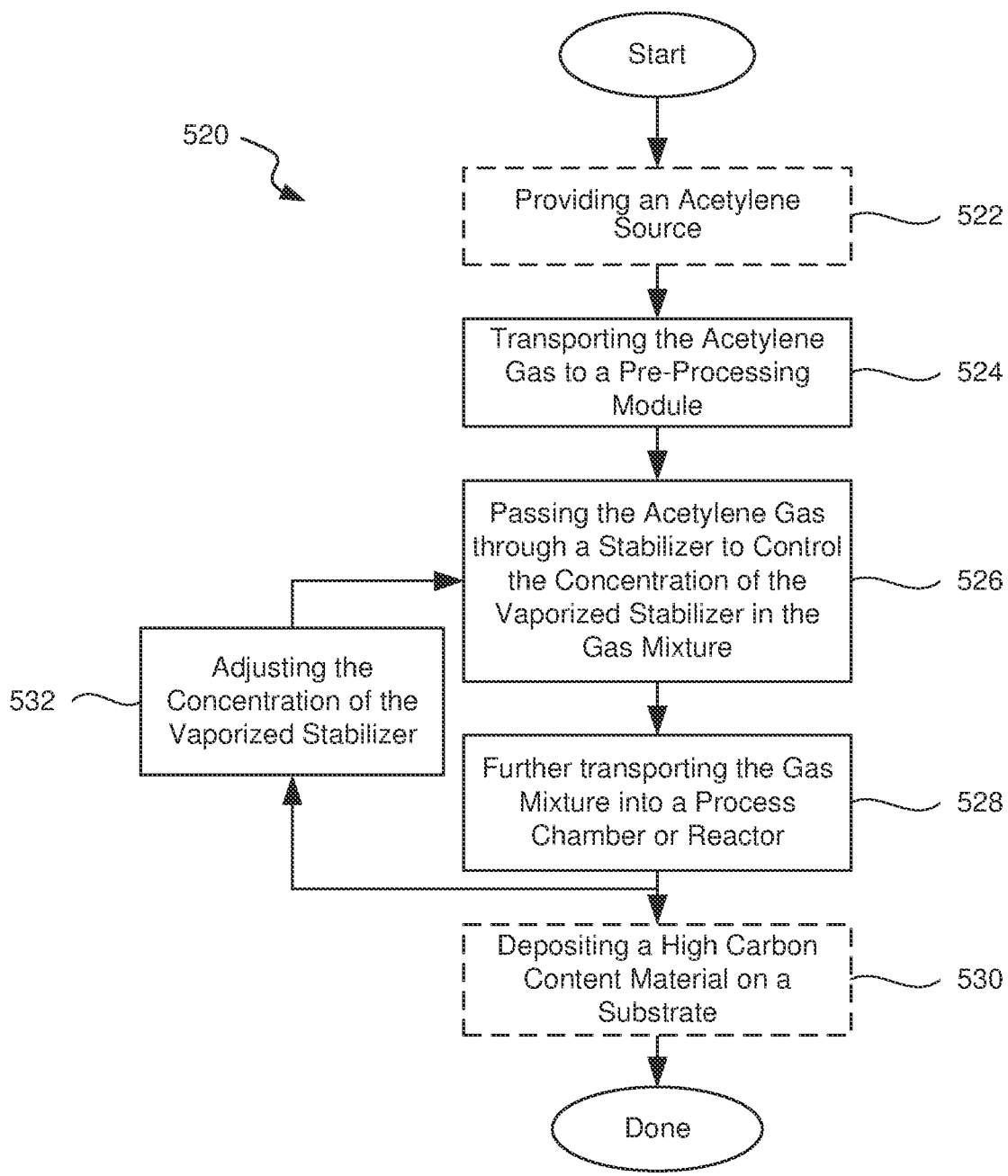

FIG. 5B is a flowchart illustrating some stages in a process flow 520 for treating an acetylene gas stream in accordance with certain embodiments. The process optionally starts with providing an acetylene source 522. By way of example, acetylene for this example may be supplied in cylinders (also referred to as bottles) storing 200-500 cubic feet of acetylene (at standard temperature and pressure), where acetylene is dissolved in or otherwise mixed with acetone. Acetylene and stabilizer may be contained in a metal cylinder with porous material, such as agamassan.

Returning to FIG. 5B, the next operation involves transporting 524 acetylene from the acetylene source to the pre-processing module. The delivery of the acetylene into the pre-processing module is driven by the pressure differential within the overall system and may be controlled by a valve on acetylene source and a mass flow controller between the pre-processing module and the deposition chamber. In certain embodiments, the pressure drop within the pre-processing module is not substantial and depends on lengths and effective diameters all paths that acetylene gas stream takes. Additionally, the pressure drop may be affected by the temperature and the composition of the acetylene gas stream. Once the acetylene gas stream fills the pre-processing module after opening the valve on the acetylene source, the acetylene gas stream may experience at least two flow regimes. One is when the deposition process operation does not require any acetylene, for example during the deposition chamber cleaning, and the acetylene gas stream remains stationary inside the pre-processing module. Another regime is when the acetylene gas stream flows through the pre-processing module and into the deposition chamber.

As the acetylene gas stream flows through the pre-processing module, it is passed through a liquid stabilizer in a chamber (block 526). This facilitates providing a steady state concentration of the acetylene stabilizer. The pre-processing module may include a variety of means to achieve the requisite concentration, as described herein. In a specific embodiment, the acetylene gas stream passes through a bubbler and/or a heat exchanger that is maintained in contact with a cooler material.

Any useful bubbler may be employed to vaporize the liquid (e.g., a precursor, a stabilizer, or an acetylene stabilizer). In one embodiment, the bubbler can include flowing a gas stream through a liquid inside a chamber of an ampoule. In particular embodiments, the chamber can provide a plurality of trays or sub-chambers in a stacked, spaced configuration to provide increased surface interface areas between the acetylene gas stream and a chosen liquid. In some embodiments, the liquid includes an acetylene stabilizer. Exemplary bubblers are described herein, as well as in U.S. Pat. No. 9,334,566, which is incorporated herein by reference in its entirety.

A variety of temperature controller types may be used for cooling and/or heating the liquid in the bubbler. Examples include a shell and tube heat exchanger, a plate heat exchanger, a regenerative heat exchanger, an adiabatic wheel heat exchanger, and others. In a specific embodiment, a set of two spiral heat exchangers is used. Additional details of non-limiting pre-processing modules are described herein in the context of FIG. 4A-4F.

The temperature of the acetylene gas stream leaving the bubbler of the pre-processing module may be close to the temperature of the bubbler liquid. In certain embodiments, the acetylene leaving the bubbler has a temperature of about −20° C. to 20° C.

Returning to FIG. 5B, the gas stream is then further transported 528 into the deposition chamber. A deposition process (block 530) requires delivery of the acetylene gas stream at controlled flow rates and only during the certain operations, such as ashable mask pre-coat and ashable mask deposition. The delivery rate and timing may be controlled using a flow controller, such as a mass flow controller.

Finally, the acetylene gas stream is delivered into the deposition chamber where the high carbon content material is deposited on the substrate 530. In general, a high carbon content material is a material containing at least about twenty-five atomic percent carbon and frequently at least about fifty atomic percent carbon. For diamond-like and graphitic films, carbon may account for up to about 100 atomic percent of the films.

Optionally, the process can include one or more feedback loops to optimize or adjust 532 the concentration of the vaporized stabilizer. Such feedback loops can include the use of one or more components, such as fluidic connections between modules or chambers to deliver one or more gas streams or vapors; concentration meters to detect the concentration of acetylene or acetylene stabilizer within the stream; as well as flow controllers, pressure controllers, and pressure regulators in use with the fluidic connection(s). Furthermore, a controller can include one or more electronic connections to any components within the feedback loop to control the stabilizer concentration delivered to the deposition chamber.

In one embodiment, a process for depositing the ashable hard mask may include the following operations: undercoat deposition, ashable hard mask pre-coat, ashable hard mask deposition, chamber cleaning at high pressure, and chamber cleaning at low pressure. The acetylene gas mass flow controller is shut during the remaining operations not involving the pre-coat or ashable hard mask deposition, which may be a significant part of the overall process. However, the valve from the acetylene source may remain open during this period and the acetylene gas stream remains in the pre-process module pressurized by the acetylene source.

Operating conditions of the pre-processing module can include those that allow for a substantially constant concentration value of the vaporized liquid leaving the bubbler. For instance, certain conditions can include about 2 vol. % to about 10 vol. % of the vaporized liquid component in the gas mixture, as determined at the outlet of the bubbler or the inlet to the process chamber. In certain embodiments, the concentration is about 3 vol. % or about 6 vol. %, including about 4 vol. % to about 5 vol. %, of the vaporized liquid component in the gas mixture. In particular embodiments, the variation of the concentration for the vaporized liquid is ±0.1%, ±0.2%, ±0.3%, ±0.5%, ±0.6%, ±0.7%, ±0.8%, ±0.9%, ±1%, ±1.1%, ±1.5%, ±1.8%, or ±2%.

The operating temperature can be of from about −20° C. to about 20° C. In particular embodiments, the operating temperature is about −15° C. to about 15° C. (e.g., from −15° C. to 10° C., −15° C. to 5° C., −15° C. to 0° C., or −15° C. to −5° C.), as determined in the chamber of the bubbler, at the outlet of the bubbler, or at the inlet to the process chamber.

Operating pressure can be maintained to be nearly constant. Non-limiting operating pressure can be of from about 600 Torr to about 1100 Torr, including from 600 Torr to 900 Torr, 600 Torr to 1000 Torr, 700 Torr to 900 Torr, 700 Torr to 1000 Torr, 700 Torr to 1100 Torr, 750 Torr to 900 Torr, 750 Torr to 1000 Torr, or 750 Torr to 1100 Torr.

Overall flow rate can be from about 1 standard liter per minute (slm) to about 20 slm (e.g., from 1 slm to 10 slm, 1 slm to 15 slm, 1 slm to 18 slm, 2 slm to 10 slm, 2 slm to 15 slm, 2 slm to 18 slm, 2 slm to 20 slm, 3 slm to 10 slm, 3 slm to 15 slm, 3 slm to 18 slm, 3 slm to 20 slm, 4 slm to 10 slm, 4 slm to 15 slm, 4 slm to 18 slm, 4 slm to 20 slm, 5 slm to 10 slm, 5 slm to 15 slm, 5 slm to 18 slm, 5 slm to 20 slm, 8 slm to 10 slm, 8 slm to 15 slm, 8 slm to 18 slm, 8 slm to 20 slm, 10 slm to 15 slm, 10 slm to 18 slm, or 10 slm to 20 slm).

Systems

The systems herein can include a source to provide a process gas, an apparatus as a pre-processing module (e.g., any described herein) to provide a vaporized liquid component for the process gas, and one or more processing reactors or modules configured to receive the gas mixture including the process gas and the vaporized liquid component. The process gas can be any gas or gas component described herein.

The pre-processing module can be fluidically coupled to the source and the processing reactor/module. For instance, the source can be coupled to the upstream flow passage of the pre-processing module, and the reactor/module can be coupled to the downstream flow passage of the pre-processing module. In this way, a gas mixture including the desired output concentration of the vaporized liquid component is delivered to the reactor or module. Fluidic connections can be made in any useful manner, in which the pre-processing module can further include a pressure regulator fluidically coupled to an upstream flow passage, and the pressure regulator is configured to be fluidically coupled to the source. The pre-processing module can further include a connection between the downstream flow passage of the pre-processing module and an inlet of the processing reactor or processing module.

The system can include one or more controllers configured to operate the source of the process gas, the pre-processing module, the processing reactor, and/or the processing module. In one non-limiting instance, the controller is configured to cause the source to deliver the process gas to the pre-processing module. In another non-limiting instance, the controller is configured to cause a bubbler of the pre-processing module to deliver a gas mixture to at least one reactor or module prior to conducting the semiconductor process. In yet another non-limiting instance, the controller is configured to cause a bubbler of the pre-processing module to continue to deliver a gas mixture to at least one reactor or module for the duration of the semiconductor process.

In another instance, the system can further include a refill source of the liquid, which supplies the chamber of the bubbler. In this embodiment, a controller (e.g., for the apparatus or the system) can be configured to cause the refill source of the liquid to deliver liquid to the bubbler (e.g., if the liquid level is below a fill line for the chamber, as determined by a liquid level sensor).

Without limitation, systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

In some implementations, a controller is part of a system, which may be part of the above-described examples. Such systems can comprise semiconductor processing equipment, including a pre-process module including an apparatus described herein to provide a vaporized liquid component; a processing tool or tools; chamber or chambers; a platform or platforms for processing; and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases (e.g., having a vaporized liquid component), temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The disclosed carbon deposition processes may be implemented in a plasma enhanced chemical vapor deposition (PECVD) reactor. Such a reactor may take many different forms. In certain embodiments, the apparatus will include one or more chambers or "reactors" (sometimes including multiple stations) that house one or more wafers and are suitable for wafer processing. During deposition, a chamber may hold one or more wafers for processing. The one or more chambers maintain the wafer in a defined position or positions during deposition. In one embodiment, a wafer undergoing hard mask deposition is transferred from one station to another within a reactor chamber during the process. For example, for certain hard mask film deposition processes, one-quarter of film thickness may be deposited at each of four stations in accordance with the disclosed embodiments. Of course, the full film deposition may occur entirely at a single station or any fraction of the total film thickness may be deposited at any number of stations.

While in process, each wafer is held in place by a pedestal, wafer chuck and/or other wafer holding apparatus. For certain operations in which the wafer is to be heated, the apparatus may include a heater such as a heating plate. In certain embodiments, a Vector® reactor, manufactured by Lam Research, Inc. of Fremont, CA, may be used to implement the disclosed embodiments.

Figure 7:
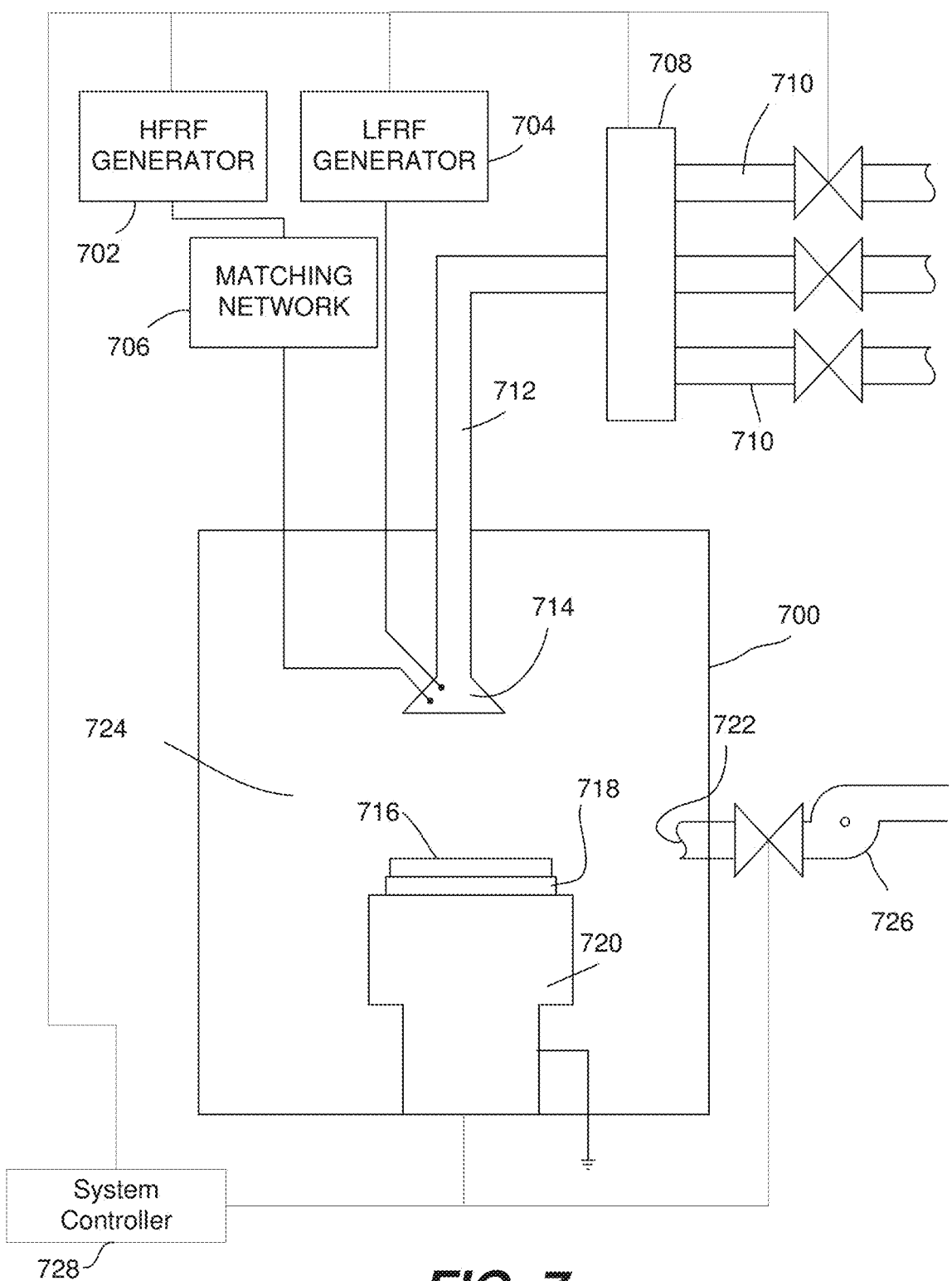
FIG. 7 shows an illustrative block diagram of various reactor components for a reactor 700.

FIG. 7 provides a block diagram depicting various reactor components which may be put into play to deposit a carbon-containing film from acetylene. As shown, a reactor 700 includes a process chamber 724, which encloses other components of the reactor and serves to contain the plasma generated by a capacitor type system including a showerhead 714 working in conjunction with a grounded heater block 720. A high-frequency RF generator 702, connected to a matching network 706, and a low-frequency RF generator 704 are connected to showerhead 714. Alternatively, a low-frequency RF generator 704 may connected to the substrate 716. The power and frequency supplied by matching network 706 is sufficient to generate a plasma from the process gas, for example, about 400 W to about 700 W total energy. In a typical process, the high frequency RF component is generally between about 2 MHz to about 60 MHz; in certain embodiments, the HF component is about 13.56 MHz. The LF component can be from about 100 kHz to about 2 MHz; in certain embodiments, the LF component is about 400 kHz Within the reactor, a wafer pedestal 718 supports a substrate 716. The pedestal may include a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

Process gases are introduced via an inlet 712. Multiple source gas lines 710 are connected to manifold 708. The gases may be premixed or not. In some embodiments, one of the gas lines 710 are configured to be fluidically coupled to a pre-processing module described herein. Valving and mass flow control mechanisms may be employed to ensure that the correct gases are delivered during the deposition and plasma treatment phases of the process. In case the chemical precursor(s) is delivered in the liquid form, liquid flow control mechanisms are employed. The liquid is vaporized and mixed with other process gases prior to deposition.

Process gases exit chamber 724 via an outlet 722. A vacuum pump 726 (e.g., a one or two stage mechanical dry pump and/or a turbomolecular pump) typically draws process gases out and maintains a suitably low pressure within the reactor by a close loop-controlled flow restriction device, such as a throttle valve or a pendulum valve.

As indicated, the disclosed embodiments may be implemented on a multi-station or a single station tool. In one embodiment, the pre-processing module is used for treating acetylene gas stream supplied to a semiconductor deposition chamber. Any deposition chamber that may use acetylene for semiconductor manufacturing can be used with pre-processing modules disclosed herein.

Semiconductor Processes, Including Deposition Process

The present disclosure includes a pre-processing module, which can be employed in conjunction with a process chamber or process module configured to receive the gas mixture having a controlled concentration of the vaporized liquid component. Such process chambers and process modules can be provided as a system (e.g., any described herein). Exemplary process systems can include, e.g., a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

The pre-processing module, in conjunction with a process chamber or process module, can be employed to perform semiconductor manufacturing processes to prepare a substrate, deposit or modify a film, create a pattern, and/or fabricate a structure. Non-limiting processes can include creating a film on a semiconductor wafer by flowing a precursor onto the wafer and then activating a reaction of the substrate surface, usually with a plasma and/or second precursor; performing an ALD process by delivering a gas mixture in one or more "dose" steps during an ALD cycle; performing a CVD process by delivering a gas mixture having one or more vaporized components; and performing an ALE process by delivering a gas mixture having one or more vaporized reactants. Yet other processes are described in U.S. Pat. Nos. 8,728,956, 8,883,028, 8,808,561, and 9,355,839, as well as U.S. Pat. Pub. No. 2011/0256734, each of which is incorporated herein by reference in its entirety.

The present disclosure also includes a general process flow for forming an ashable hard mask in accordance with certain embodiments. The general process flow can include providing a semiconductor substrate in a deposition chamber, introducing a process gas containing acetylene, and depositing a carbon-containing layer such as an ashable hardmask.

Ashable hardmasks are carbon-based films used as etch masks that can be removed after use by oxidation. In certain embodiments, they are amorphous carbon-based films. Amorphous carbon-based films may also be used to form other types of films used in semiconductor processing. In certain embodiments, a deposition process begins with providing a semiconductor substrate in a deposition chamber. For example, a semiconductor substrate may be a 300 mm semiconductor wafer and the deposition chamber may be a module in the Lam Research Vector® family. A precursor process gas including acetylene is then introduced into the chamber.

Depending on deposition chamber size and other process parameters the flow rate of acetylene may be about 3,000 sccm to about 10,000 sccm during the deposition process. In one embodiment, the flow rate of acetylene may be about 5,000 sccm to about 8,000 sccm. In addition to acetylene, the process gas may also include other carbon-containing precursors, such as methane, ethylene, propylene, butane, cyclohexane, benzene, toluene, and the like. While acetylene-containing gas flows to the deposition chamber, an ashable hard mask is deposited on the semiconductor substrate by a plasma enhanced chemical vapor deposition (PECVD) or other deposition processes.

A carrier gas may be used to dilute the precursor or the gas mixture from the pre-processing module. The carrier gas may include any suitable carrier gas employed in semiconductor processing, such as helium, argon, nitrogen, hydrogen, or a combination of these. The overall carrier gas flow rate may depend on deposition chamber size and other process parameters and may range from about 500 sccm to about 10,000 sccm. In a specific embodiment nitrogen and helium are used as carrier gases having corresponding flow rates ranges of about 500 sccm to about 5,000 sccm and about 300 sccm to about 3,000 sccm. Other stages of semiconductor processing may include different processing gases and different flow rates.

Many of the process parameters listed here are appropriate for depositing carbon films using a Lam Research Vector® module having four deposition stations for depositing an ashable hardmask on a 300 mm wafer. In certain embodiments, the process includes four operations: undercoat deposition, ashable hard mask pre-coat, ashable hard mask deposition, and chamber cleaning. The acetylene gas stream may be used in the ashable hard mask pre-coat and/or ashable hard mask deposition operations. In certain embodiments, the acetylene gas stream that passes through the pre-processing module is delivered at a flow rate of about 7000 sccm during these operations.

However, the disclosed embodiments apply more broadly to any semiconductor deposition chamber using acetylene gas stream for semiconductor processing. One skilled in the art will readily appreciate that the process parameters may be scaled based on the deposition chamber volume, wafer size, and other factors. For example, power outputs of low frequency (LF) and high frequency (HF) generators are typically directly proportional to the deposition surface area of the wafer. Similarly, flow rates depend on the free volume of the deposition chamber, which is 195 L for each of four deposition chambers in a Vector® deposition chamber.

Plasma may be generated using dual-frequency plasma generation process. In one example, the dual-frequency PECVD module may provide low frequency (LF) power of about 200 W to about 600 W and high frequency (HF) power at about 900 W to about 1500 W during these operations, while the process chamber was maintained at approximately 4 Torr to 12 Torr. In another example, a LF generator may provide about 200 W to about 1000 W at about 50 kHz to about 400 kHz, while a HF generator may provide about 500 W to about 2,000 W at about 2 MHz to about 60 MHz during the deposition process. The deposition process may be performed when substrate temperature is between about 100° C. and 500° C. The pressure of the deposition chamber may be maintained at about 2 Torr to about 15 Torr. One example of process conditions for ashable hard mask deposition is summarized in Table 1. Deposition is continued until the desired thickness of film is deposited. According to various embodiments, between about 1,000 and 9,000 angstroms is deposited.

TABLE 1

| Parameter | Typical Process Range |
|---|---|
| $C_2H_2$ Flow Rate | 1,000-10,000 sccm |
| $N_2$ Flow Rate | 0-5,000 sccm |
| He Flow Rate | 0-3,000 sccm |
| $H_2$ Flow Rate | 0-10,000 sccm |
| LF Power at Frequency | 0-2,400 W at 50-400 kHz |
| HF Power at Frequency | 500-2,000 W at 2-60 MHz |
| Pressure | 0.5-15 Torr |
| Temperature | 150-700° C. |
| Total Deposited Thickness | 250-10,000 Å |

It should be understood that the disclosed embodiments are not limited to the deposition of ashable hardmask films at the process conditions above but apply to deposition of any carbon-based film using acetylene as a precursor in semiconductor processing. This includes, but is not limited to, plasma-enhanced CVD processes, thermal CVD processes, high density plasma CVD, atomic layer deposition (ALD) processes, etc. All of the above process conditions may be varied outside the example ranges shown in Table 1, so long as acetylene is used as a process gas.

While examples of flow rates are described above in Table 1, in certain embodiments, the methods disclosed herein are used with low flow rate processes, e.g., about 100 sccm to about 1000 sccm of acetylene flow or lower. Dilution at these low flow rates may be particularly detrimental to the repeatability, so the use of low vapor pressure stabilizers with the pre-processing module herein may be advantageous in some instances.

EXAMPLES

Example 1: Control of Stable Stabilizer Concentration in Acetylene

Figure 9A:
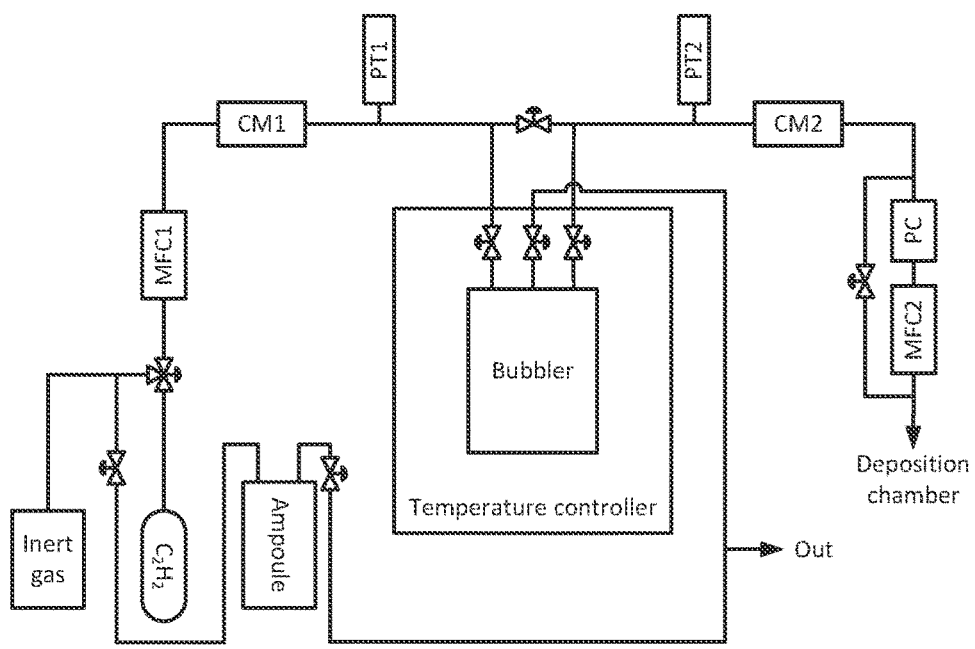
FIG. 9A-9B shows control of stabilizer concentration in acetylene. Provided are (A) an illustrative block diagram of the pre-processing module connected to a deposition chamber and (B) a graph showing results of sensor measurements for components arranged as in FIG. 9A.
Figure 9B:
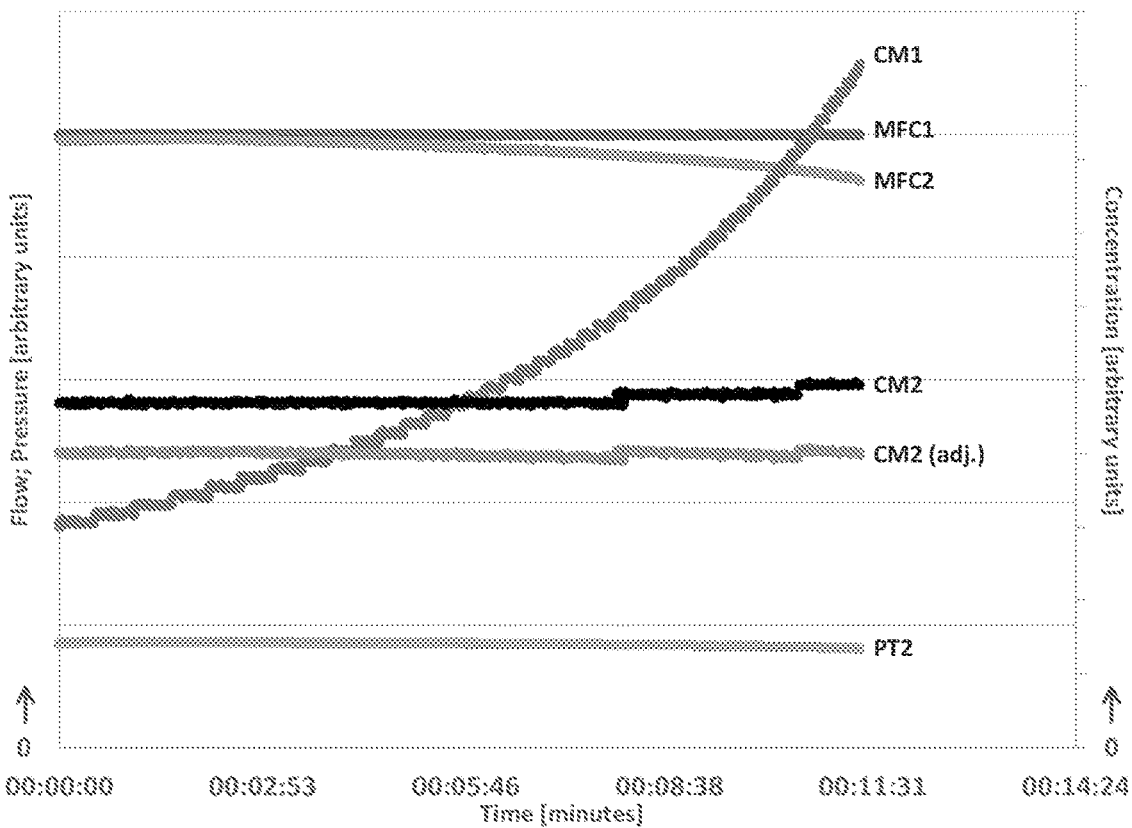

FIG. 9A-9B shows illustrative results from a pre-processing module employed to control the concentration of stabilizer within acetylene. FIG. 9A shows a non-limiting diagram of the pre-processing module configured to be fluidically coupled to a source and a deposition chamber. An ampoule supplies a liquid to the bubbler by way of a connection, and a source supplies acetylene ($C_2H_2$) to the bubbler. The liquid in the ampoule include a stabilizer, and the source also include a certain concentration of stabilizer dissolved within acetylene.

The pre-processing module can further include an upstream flow passage between the source and the bubbler, in which this flow passage includes a first mass flow controller (MFC1), a first concentration meter (CM1), and a first pressure transducer (PT1). The downstream flow passage is located between the bubbler and the deposition chamber, and this flow passage includes a second pressure transducer (PT2), a second concentration meter (CM2), a pressure controller (PC), and a second mass flow controller (MFC2). A bypass pathway connects the upstream and downstream flow passages and has a valve disposed therein. The bubbler can optionally be housed within a heat exchanger. The connection between the ampoule and the bubbler can be configured to deliver additional liquid to the bubbler and to remove excess liquid by condensing and evacuating by way of an outlet.

FIG. 9B shows results of using such an apparatus to control the concentration of the stabilizer. As can be seen, CM1 and CM2 were employed to measure concentration of the stabilizer within the gas mixture traveling through the upstream flow passage and downstream flow passage, respectively. As can be seen, the concentration determined by upstream CM1 shows a steady increase in the stabilizer concentration over time, indicating that concentration within the upstream flow passage can be variable. However, the concentration determined by downstream CM2 shows a relatively steady concentration in the downstream flow passage, thus providing a steady concentration to the output or, in this instance, to the deposition chamber. As can be seen, the use of a bubbler between the upstream and downstream flow passages impacts the output stabilizer concentration, especially when such use is provided in an apparatus having controlled temperature (e.g., by use of a heat changer) and controlled pressure (e.g., as evidenced by the steady pressure measured by PT2 in FIG. 9B).

FIG. 9B also depicts different operating spaces that can be controlled by the apparatus described herein. For instance, the intersection of the curves measured by CM1 (incoming stabilizer concentration) and by CM2 (outgoing stabilizer concentration) divides the operating space into two realms, in which stabilizer can be added to the gas stream (left side) or stabilizer can be removed from the gas stream (right side). Operating in the left side may eventually require replenishing stabilizer within the bubbler, such as by delivering additional liquid from the ampoule by way of a connection. Operating in the right side may eventually require removing stabilizer from the bubbler, such as by condensing excess stabilizer. When removing stabilizer, excess amounts can be recycled to the stabilizer source or dumped to vacuum (possibly via foreline for the deposition chamber) by way of an exit pathway.

Example 2: Further Control of Stable Stabilizer Concentration in Acetylene

Figure 10A:
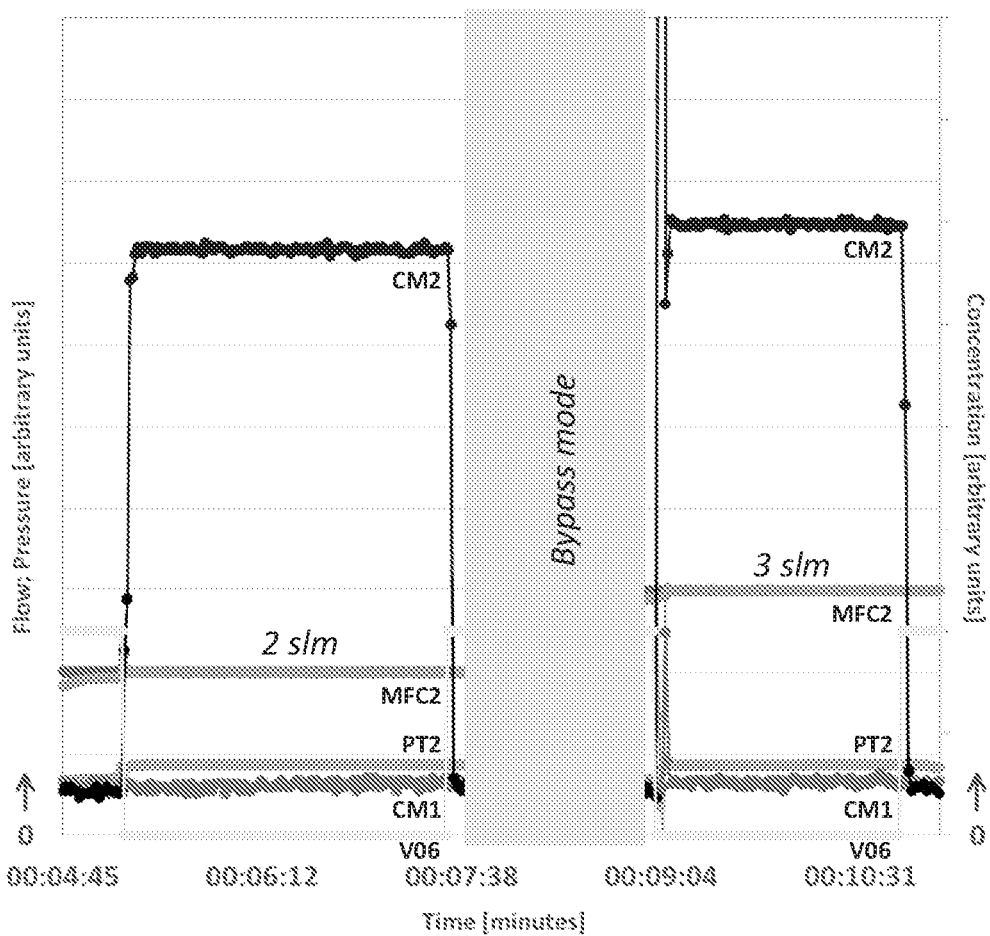
FIG. 10A-10B shows further control of stabilizer concentration in acetylene using downstream flow control. Provided are graphs showing results of sensor measurements for flow rates of (A) 2 slm and 3 slm and (B) 5 slm and 8 slm. Components in the pre-processing module were arranged as in FIG. 9A.

The apparatuses, systems, and methods herein can be employed to provide a controlled stabilizer concentration over various flow rate by controlling the downstream flow passage. As can be seen in FIG. 10A, downstream control of the downstream flow controller (MFC2) provided a controlled output stabilizer concentration (as indicated by data provided with CM2). In order to achieve fixed pressure (as indicated by data provided with PT2), closed loop control of the pressure controller was employed. Flow from the bubbler is indicated as being off or on (as indicated by data provided with V06).

Figure 10B:
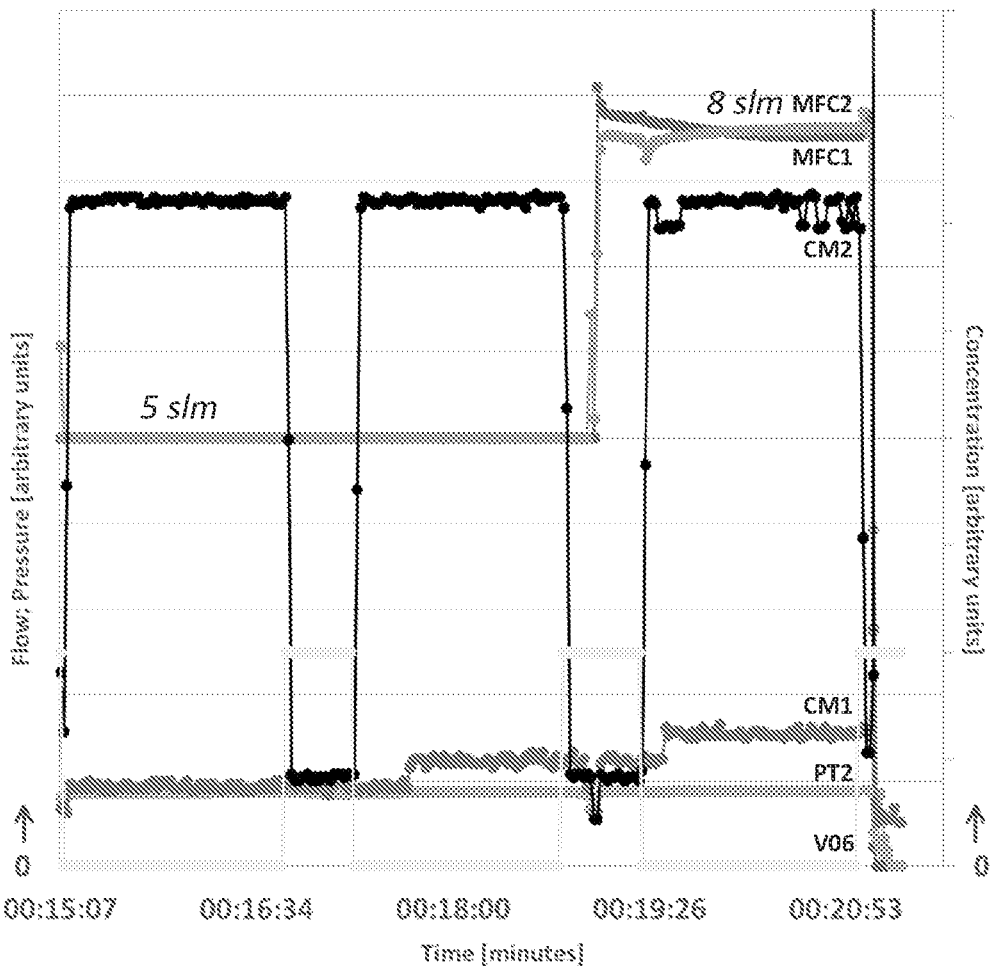

Without careful control of the bubbler, and particularly pressure control in the bubbler, the downstream stabilizer concentration could vary with input acetylene flow rate. However, as seen in FIG. 10B, the downstream stabilizer concentration remains constant over a wide range of input acetylene flow rates and input stabilizer concentration. This is due to controlling the temperature and pressure in the bubbler to a constant level.

Definitions

As used herein, the terms "top," "bottom," "upper," "lower," "above," and "below" are used to provide a relative relationship between structures. The use of these terms does not indicate or require that a particular structure must be located at a particular location in the apparatus.

CONCLUSION

Although the foregoing embodiments have been described in some detail for purposes of clarity of understanding, it will be apparent that certain changes and modifications may be practiced within the scope of the appended claims. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:
1. An apparatus comprising:
(a) an upstream flow passage configured to be fluidically coupled to a source of an acetylene and an acetylene stabilizer, and configured to transport a gas mixture of acetylene and acetylene stabilizer from the source of acetylene and acetylene stabilizer;

(b) a bubbler comprising an inlet fluidically coupled to the upstream flow passage (a), and comprising a chamber for holding a liquid under an atmosphere having a controlled temperature and pressure, wherein the bubbler is configured to:
 (i) receive the gas mixture of acetylene and acetylene stabilizer from the upstream flow passage (a), and
 (ii) pass the gas mixture of acetylene and acetylene stabilizer through the liquid in the chamber;

(c) one or more controllers configured to cause the bubbler to operate under conditions that adjust a concentration of the acetylene stabilizer in the gas mixture of acetylene and acetylene stabilizer flowing into the bubbler, and that maintain the concentration of the acetylene stabilizer in the gas mixture of acetylene and acetylene stabilizer leaving the bubbler at a substantially constant concentration value over a course of a deposition reaction that reacts acetylene; and (d) a downstream flow passage fluidically coupled to an outlet of the bubbler and configured to transport the gas mixture of acetylene and acetylene stabilizer at the substantially constant concentration value to a deposition reactor for conducting the deposition reaction.

2. The apparatus of claim 1, further comprising a gas concentration meter fluidically coupled to the upstream flow passage (a) and/or the downstream flow passage (d) and configured to measure a concentration of the acetylene and/or the acetylene stabilizer in the upstream and/or downstream flow passage(s).

3. The apparatus of claim 1, further comprising a valve fluidically coupled to the upstream flow passage (a) and configured to adjust a flow of the gas mixture of acetylene and acetylene stabilizer from the source to the bubbler.

4. The apparatus of claim 1, wherein the substantially constant concentration value is a saturation concentration of the acetylene stabilizer in acetylene at the controlled temperature and pressure of the atmosphere in the bubbler.

5. The apparatus of claim 4, wherein the substantially constant concentration value of the acetylene stabilizer is less than an initial concentration value of the acetylene stabilizer within the source of acetylene and acetylene stabilizer.

6. The apparatus of claim 4, wherein the substantially constant concentration value of the acetylene stabilizer is greater than an initial concentration value of the acetylene stabilizer within the source of acetylene and acetylene stabilizer.

7. The apparatus of claim 1, wherein the substantially constant concentration value is about 2 vol. % to about 10 vol. % of the acetylene stabilizer in acetylene.

8. The apparatus of claim 7, wherein the bubbler is configured to maintain the liquid, during operation, at a temperature of between about −20° C. and about 20° C.

9. The apparatus of claim 8, wherein the bubbler is configured to maintain the atmosphere, during operation, at a pressure of between about 600 Torr and about 1100 Torr.

10. The apparatus of claim 8, wherein the bubbler is configured to provide a flow rate between about 1 slm to about 20 slm.

11. The apparatus of claim 1, wherein the bubbler comprises a plurality of trays.

12. The apparatus of claim 11, wherein the bubbler comprises a liquid level sensor or wherein the bubbler is fluidically coupled to a liquid level sensor.

13. The apparatus of claim 1, wherein the liquid in the bubbler is maintained near or at a predetermined liquid level.

14. The apparatus of claim 1, wherein said controlled temperature and pressure is configured to be a substantially constant temperature and a substantially constant pressure.

15. The apparatus of claim 1, further comprising a pressure controller fluidically coupled to the upstream flow passage (a) and/or the downstream flow passage (d) and configured to maintain a pressure of the gas mixture of acetylene and acetylene stabilizer within a defined pressure range in the upstream and/or downstream flow passage(s).

16. The apparatus of claim 15, wherein the one or more controllers are coupled to the pressure controller and configured to control the pressure controller.

17. The apparatus of claim 1, further comprising a temperature controller coupled to the bubbler and configured to maintain a temperature of the gas mixture of acetylene and acetylene stabilizer within a defined temperature range in the downstream flow passage (d).

18. The apparatus of claim 1, further comprising a mass flow controller fluidically coupled to the upstream flow passage (a) and/or the downstream flow passage (d) and configured to maintain a mass flow rate of the gas mixture of acetylene and acetylene stabilizer within a defined mass flow rate range in the upstream and/or downstream flow passage(s).

19. The apparatus of claim 1, wherein the one or more controllers are further configured to cause the bubbler to maintain the liquid at a substantially constant temperature and/or a substantially constant pressure during the deposition reaction.

20. The apparatus of claim 1, wherein the one or more controllers are further configured to cause the bubbler to control the temperature and the pressure of the atmosphere in the bubbler during the deposition reaction.

21. The apparatus of claim 1, wherein the one or more controllers are further configured to control a flow rate of the gas mixture of acetylene and acetylene stabilizer through the bubbler.

22. The apparatus of claim 1, further comprising a valve fluidically coupled to the bubbler and configured to deliver a push gas to a headspace in the chamber of the bubbler.

23. The apparatus of claim 1, further comprising an exit pathway fluidically coupled to the bubbler and configured to remove an excess of the liquid in the chamber of the bubbler.

24. The apparatus of claim 1, wherein the downstream flow passage (d) is further configured to be fluidically coupled to one or more reactors or additional chambers that are configured to receive the gas mixture of acetylene and acetylene stabilizer.

25. The apparatus of claim 24, wherein the acetylene stabilizer in the gas mixture leaving the bubbler comprises the substantially constant concentration value over a course of a semiconductor process.

26. A system comprising:
 a source configured to provide a process gas, wherein the process gas comprises acetylene or a gas component;
 one or more reactors or modules configured to conduct a semiconductor process, wherein at least one reactor or module further comprises an inlet;
 an apparatus of claim 1 configured to provide a gas mixture, wherein the upstream flow passage (a) is fluidically coupled directly or indirectly to the source, and wherein the downstream flow passage (d) is fluidically coupled directly or indirectly to the inlet of said at least one reactor or module; and one or more controllers configured to cause the source to deliver the process gas to the apparatus and to cause a bubbler of the apparatus to transport the gas mixture to said at least one reactor or module prior to conducting the semiconductor process.

* * * * *